United States Patent [19]
Bongiorno

[11] Patent Number: 4,991,226
[45] Date of Patent: Feb. 5, 1991

[54] FM DETECTOR WITH DEVIATION MANIPULATION

[76] Inventor: James W. Bongiorno, P.O. Box 4835, Santa Barbara, Calif. 93140

[21] Appl. No.: 366,750

[22] Filed: Jun. 13, 1989

[51] Int. Cl.⁵ .......................... H04B 1/16; H04B 1/26
[52] U.S. Cl. .................................. 455/200; 455/254; 455/260; 455/264; 455/316
[58] Field of Search ............... 455/165, 214, 183, 207, 455/208, 209, 260, 265, 315, 316, 317, 45, 295, 261, 262, 264, 192, 182, 336, 339, 200, 254; 329/50, 117, 122, 118, 124, 125; 331/2, 18, 22

[56] References Cited

U.S. PATENT DOCUMENTS

| | | | |
|---|---|---|---|
| 2,075,503 | 3/1937 | Chaffee | 455/42 |
| 2,272,401 | 2/1942 | Chaffee | 455/210 |
| 2,273,110 | 2/1942 | Kimball et al. | 455/208 |
| 2,502,154 | 3/1950 | Jeffers | 375/88 |
| 2,510,906 | 6/1950 | Reid | 455/207 |
| 3,053,981 | 9/1962 | Turner et al. | 455/208 |
| 3,231,822 | 1/1966 | Tillotson | 455/208 |
| 3,238,460 | 3/1966 | Enloe | 455/208 |
| 3,346,814 | 10/1967 | Haggai | 329/325 |
| 3,371,281 | 2/1968 | Powell | 455/208 |
| 3,544,899 | 12/1970 | Gusyatinsky et al. | 455/207 |
| 4,087,756 | 5/1978 | Rogers, Jr. | 329/50 |
| 4,092,602 | 5/1978 | Nishioka et al. | 381/3 |
| 4,237,556 | 12/1980 | Naito | 455/154 |
| 4,293,818 | 10/1981 | Jarger | 329/50 |
| 4,476,586 | 10/1984 | Ishida | 455/207 |
| 4,545,072 | 10/1985 | Skutta et al. | 455/315 |
| 4,551,856 | 11/1985 | Victor et al. | 455/183 |
| 4,569,085 | 2/1986 | Nolde et al. | 455/208 |
| 4,658,438 | 4/1987 | Kamata et al. | 455/264 |
| 4,661,995 | 4/1987 | Kashinagi | 455/183 |

FOREIGN PATENT DOCUMENTS 2902491 8/1979 Fed. Rep. of Germany ...... 455/207

OTHER PUBLICATIONS

"Technics Service Manual ST-G7," 1978, pp. 18-19.
"Pioneer Service Manual F-91," 8/87, pp. 35-38.

Primary Examiner—Gerard R. Strecker
Assistant Examiner—Curtis Kuntz
Attorney, Agent, or Firm—Poms, Smith, Lande & Rose

[57] ABSTRACT

An FM detection system receives an FM input signal containing a plurality of carrier bands, including a tuned carrier band. The tuned carrier band is separated from side carrier bands by a frequency guard band. A detected, demodulated output signal is fed back to at least one local oscillator, which generates corresponding local FM signals having a deviation which is in phase with the deviation of the tuned carried. The FM input signal and the local FM signal are inputs to a guard band expansion device. The guard band expansion device includes a harmonics generator which produces an output spectrum which is a multiple of its input spectrum. In one embodiment, the harmonics generator operates directly on the FM input signal, its output signal then being beat by a mixer with the local FM signal. In another embodiment, the operations of harmonics generation and mixing are reversed. In all embodiments, the guard band separating the detected tuned carrier from side carriers is much greater than the input frequency guard band. In other embodiments, a plurality of mixers, oscillators, and/or harmonics generators is used to achieve high-order guard band expansion.

20 Claims, 11 Drawing Sheets

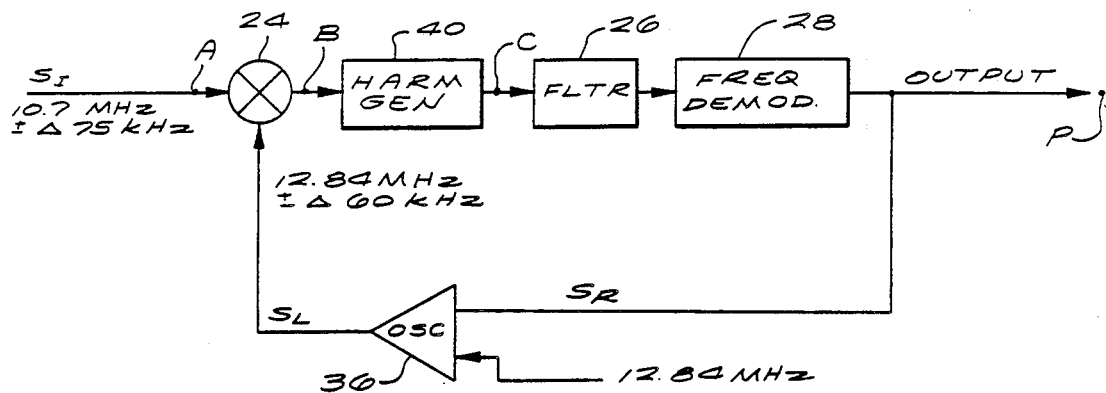
FIG. 4
FIG. 5
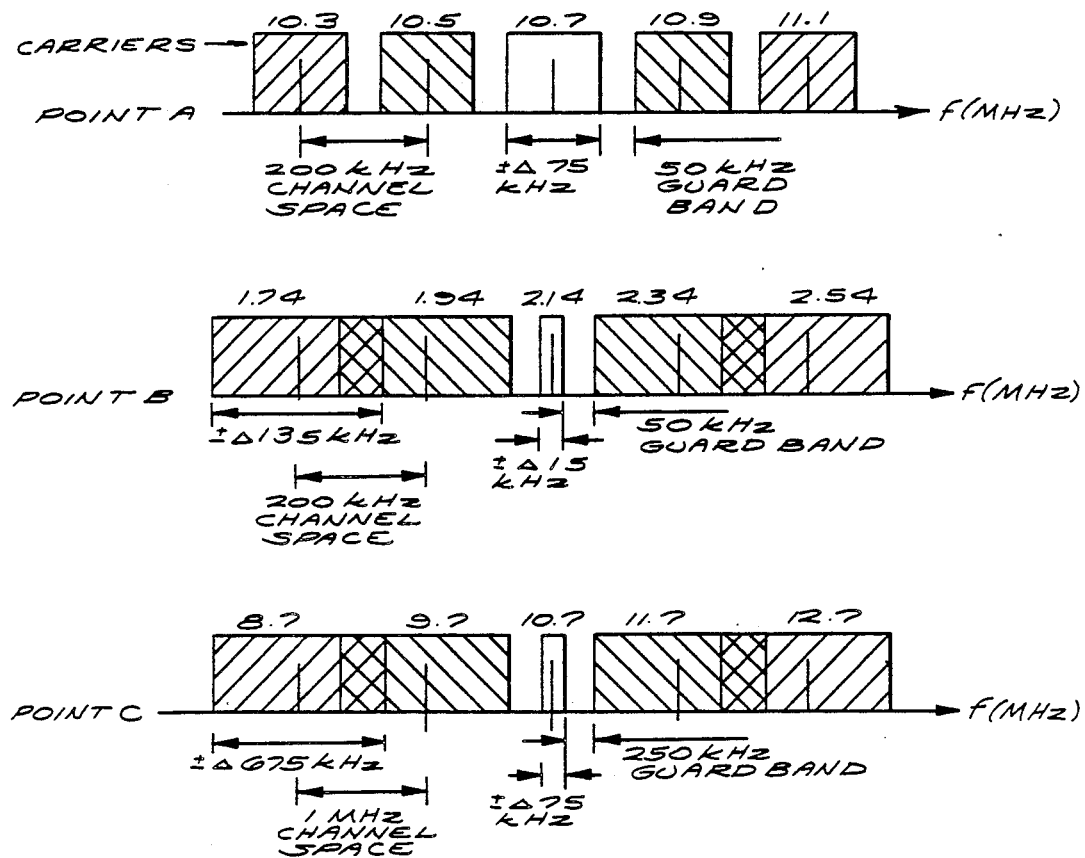

FIG. 8
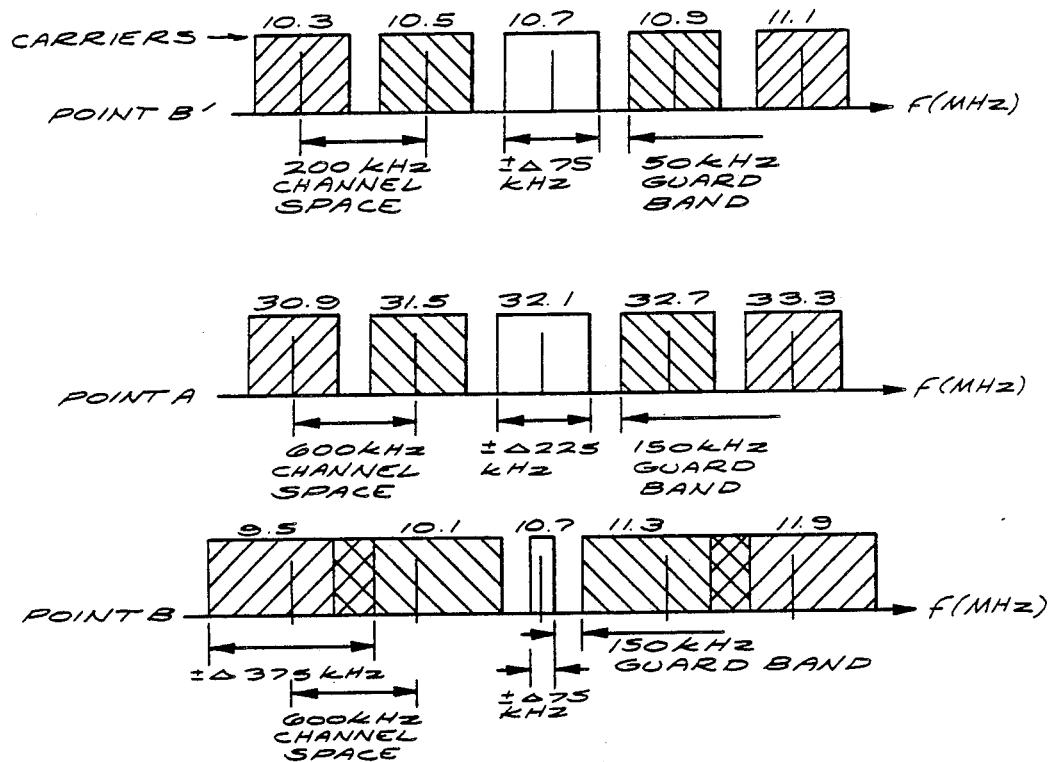
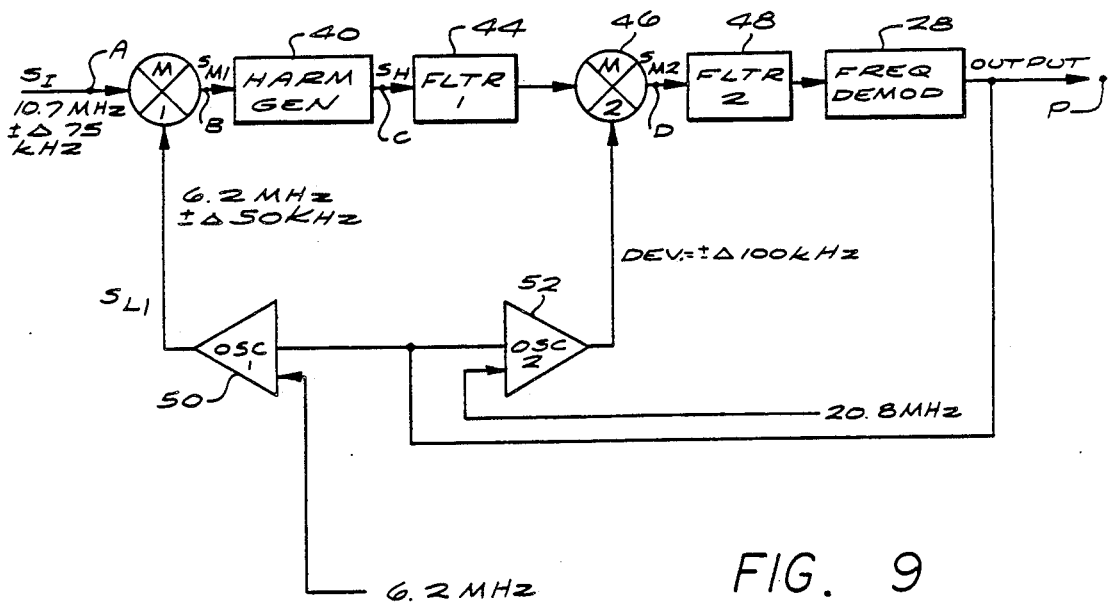
FIG. 9

FM DETECTOR WITH DEVIATION MANIPULATION

FIELD OF THE INVENTION

The present invention relates to a detector for use in a frequency modulated ("FM") communications receiver system.

BACKGROUND OF THE INVENTION

Improvement of the selectivity, distortion, and signal-to-noise characteristics is a major goal of most communications receivers. Accordingly, FM detectors are now widely available which employ well-known techniques for achieving extremely good noise rejection and low distortion levels. Such extremely low distortion levels have not, however, been achieved in a very narrow band intermediate frequency ("IF") system. Prior art systems having the highest level of available performance relied on standard but extremely expensive techniques.

Two representative examples of prominent prior art designs are the Model 10B receiver manufactured by the Marantz Company and the Model 1 receiver manufactured by the Sequerra Company. Both of these prior art receivers used 18-pole LC coupled filters in the IF stages. These filters used pot core technology and were exceedingly expensive. Furthermore, although these receivers exhibited exceptionally good mid-band performance, they still suffered from the problem of high-frequency distortion. The Marantz and Sequerra systems achieved approximately 35–40 dB of adjacent channel selectivity and did not require any wide/narrow switching of the IF bandwidth. This performance was, however, achieved only at the great expense of pot core technology, which was typically too expensive for use in consumer products. The expense was increased further because the alignment procedure required for these types of IF circuits is both tedious and time consuming. A long-standing goal has therefore been to achieve equal or better performance more inexpensively.

One response to the need for a less expensive yet equally selective system has been the development of low cost ceramic filters. Such ceramic filters have in fact become standard in IF filter designs. Linearity of group delay is necessary to achieve low distortion, especially at high audio frequencies of approximately 6 kHz to 15 kHz. In conventional ceramic devices, linearity of group delay is generally achieved at the expense of bandwidth so that the bandwidth is too wide, and the slopes of the flanks of the filters are not steep enough to achieve good selectivity. In order to increase the slope of the flanks of the filters, many filters must be used in series; however, doing so causes a progressive increase of the non-linear group delay, which in turn leads once again to the above-mentioned increase in distortion at high audio frequencies. Additionally, such ceramic filters are not adjustable.

In view of the drawbacks of ceramic filters, some designers have reverted to using adjustable, equalizing LC filter sections in an attempt to offset or reverse the buildup of group delay distortion. A reversion to using LC filter sections, however, also means a reversion to the above-mentioned drawbacks of such filter sections. Furthermore, these efforts have generally not improved the spurious response rejection of the filter, since the stop band performance of ceramic filters is typically quite poor.

Another well-known technique for improving the performance of FM detectors employs negative feedback, from the output of the detector back to one or more local oscillators. U.S. Pat. No. 2,075,503 (Chaffee) describes a device which is representative for this class of detectors. All such detectors using negative feedback employ the concept of bandwidth compression or deviation modification ("DM"), but none of them address the most important aspect of the technique: the reapportionment of the spacing between the adjacent and alternate carriers next to the desired carrier. These techniques improve the distortion performance by reducing the deviation, but they still require the use of expensive filters in the IF stages. Furthermore, many of these negative feedback systems fail to alleviate the problem of image interference.

All prior art negative feedback systems use feedback from the FM detector to drive some form of reactance modulator, local oscillator, or voltage controlled oscillator ("VCO") in such a direction that the net carrier deviation through a mixer is reduced. This is, however, not true bandwidth reduction since the effective detected bandwidth remains the same. Because of their typical use of superheterodyne down conversion, these negative feedback systems exhibit poor if any image rejection. No superheterodyne technique can function properly without pre-filtering to remove the image frequency. However, with successive down conversions, the problem of image frequencies becomes progressively worse, since the frequency bands and VCO frequencies become closer, thus necessitating even more filtering; indeed, the increasingly stringent filtering requirements caused by the proximity of the carrier and VCO frequencies set practical limits on the achievable performance of these systems. Likewise, the greater the negative feedback which is applied from the detector back to the VCO, the more the deviation is reduced. Eventually, as in all negative feedback systems, the system gain is reduced to near unity, in which case the detector output approaches zero and renders the detector useless When dealing with the standard FM IF frequency of 10.7 MHz, a mathematically practical upper limit is reached for a deviation reduction factor of approximately five. This upper limit is also recommended by Turner, et al. in U.S. Pat. No. 3,053,981.

Further drawbacks of prior art negative feedback systems are illustrated by the following example:

Assume a standard FM IF frequency of 10.7 MHz with a deviation of $\pm\Delta 75$ kHz. Assume further that a deviation reduction factor of five is used. It can be shown mathematically that the frequency translation of the superheterodyne mixer should also be of the same magnitude. For example, if the deviation is to be reduced by a factor of five from the original $\pm\Delta 75$ kHz to $\pm\Delta 15$ kHz, the frequency of the local oscillator should be 12.84 MHz, thus yielding a mixer output difference frequency of 2.14 MHz = 10.7 MHz / 5. The new second IF frequency then becomes 2.14 MHz with a deviation of $\pm\Delta 15$ kHz.

It is important to note that this down mixing must be preceded by some kind of filtering, either of the incoming radio frequency ("RF") or, preferably, of the incoming IF signal of 10.7 MHz. The reason for this is that the new image above the VCO will be at 14.98 MHz which will also produce an output from the mixer at the desired 2.14 MHz. Assuming the standard channel spacing of 200 kHz, the two carriers at 14.9 MHz and 15.1 MHz would thus be close enough to cause total interference and must be removed by pre-filtering. Plainly, if the reduction factor were increased from five to, e.g., seven, nine, etc., the problem of signal images would become significantly worse and increase the difficulty of filtering even further. Eventually, it would not be practically possible to create a sufficiently selective filter.

Accordingly, the object of the present invention is to provide an FM detector whose distortion and signal-to-noise characteristics are greatly improved compared to the prior art. The FM detector according to the invention achieves the following primary goals:

1. Significant reduction of co-channel interference through removal of interfering adjacent and alternative side bands.
2. Elimination of the need for expensive LC filters while greatly reducing distortion through the use of existing inexpensive ceramic filters, which require no tuning.
3. Avoidance of the necessity for extremely high order filters having steep slopes, without worsening the capture ratio of the detector.
4. Enabling isolation and/or measurement of multipath interference.
5. Elimination of the problem of "birdie" beats, which typically occur in the stereo multiplex decoding sections of prior art FM receivers.
6. Elimination of the need for IF band switching and associated switching hardware.

SUMMARY OF THE INVENTION

An FM detection system receives an FM input signal containing a plurality of carrier bands, including a tuned carrier band. The tuned carrier band is separated from side carrier bands by a frequency guard band. A detected, demodulated output signal containing a detected tuned carrier is fed back to at least one local oscillator, which generates corresponding local FM signals having a deviation which is in phase with the deviation of the tuned carried. The FM input signal and the local FM signal are inputs to a guard band expansion device. The guard band expansion device includes a harmonics generator which produces an output spectrum which is a multiple of its input spectrum.

In one embodiment of the present invention, the harmonics generator operates directly on the FM input signal, its output signal then being beat by a mixer with the local FM signal. In another embodiment, the operations of harmonics generation and mixing are reversed.

In all embodiments of the present invention, the guard band separating the detected tuned carrier from side carriers is much greater than the input frequency guard band.

In order to increase the isolation of the tuned carrier, other embodiments include a plurality of mixers, oscillators, and/or harmonics generators to achieve high-order guard band expansion.

BRIEF DESCRIPTION OF THE DRAWINGS

FIG. 4 is a schematic block diagram of a first embodiment of the present FM detector;

FIG. 5 shows representative frequency spectra for chosen points in the first and second embodiments of the present invention;

FIG. 8 shows representative frequency spectra at chosen points in the third and fourth embodiments;

FIG. 9 is a schematic block diagram of a fifth embodiment of the present FM detector;

FIG. 15B is a continuation of FIG. 15A.

DETAILED DESCRIPTION

In the following description, it will be assumed that the FM detector according to the present invention is to be used in a system for receiving and reproducing FM signals broadcast over the standard commercial FM radio bands. This is, however, by way of example only; the present invention is equally useful in other systems, e.g., radar, cellular phones, etc., where frequency modulated signals are to be processed and decoded. Alternative applications of the present invention will be described below.

Figure 1:
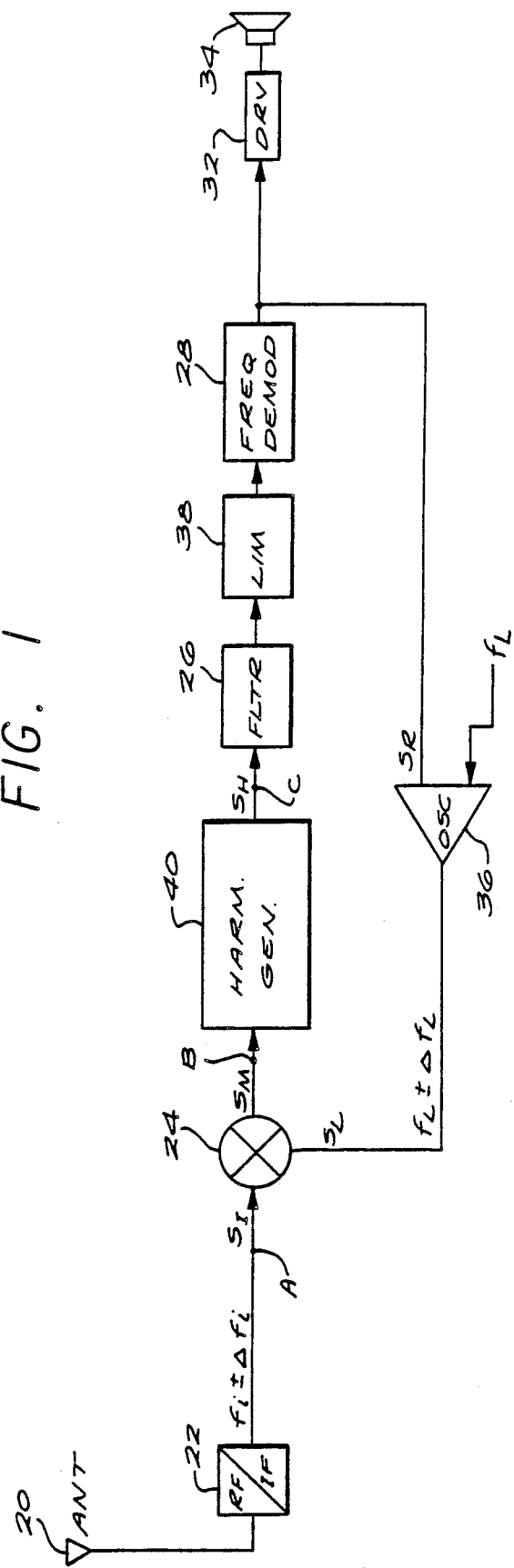
FIG. 1 is a schematic block diagram of an FM receiver which incorporates a second embodiment of the present invention.

Referring more particularly to the drawings, FIG. 1 is a schematic block diagram of a general system for reception and reproduction of broadcast FM signals. The system shown in FIG. 1 will also serve as an introduction to the terminology and type of components which will be employed in the various described embodiments of the present invention.

In FIG. 1, a conventional antenna 20 is provided for receiving radio frequency ("RF") signals in the standard commercial FM broadcast band, which ranges from approximately 88 MHz to approximately 108 MHz. As is well known in the art, the FM broadcast band contains a spectrum of FM carriers each having a deviation of approximately $\pm\Delta75$ kHz about the respective center frequency. The distribution of the carriers throughout the band is normally such that the center frequencies of the carriers are spaced 200kHz apart. Adjacent carrier bands are therefore completely separated by a guard band of approximately 50 kHz.

The RF signal received by the antenna 20 is first processed by a conventional front end 22. The front end 22, which may be of a conventional design, converts the received RF spectrum into an intermediate frequency ("IF") spectrum and will typically include an RF amplifier, a superheterodyne mixer, a local oscillator, and other circuitry. The design of such a front end is well-known in the art and will therefore not be described in further detail. In order to understand the illustrative embodiments described herein, it is sufficient to note that the front end 22 converts the received RF spectrum into an IF spectrum in which a desired tuned carrier, in accordance with accepted international standards, is centered at 10.7 MHz. The output from the front end 22 is shown generally in FIG. 1 as having the spectrum $f_i \pm \Delta f_i$. In the present example in which the international standards for commercial FM frequency conversion have been assumed, the dominant component of the output signal from the front end 22 is the 10.7 MHz $\pm \Delta 75$ kHz tuned carrier. The amplitude of other carrier frequency bands is attenuated by the front end 22.

The output signal $S_I$ from the RF/IF converter 22 forms one input signal to a frequency translation device such as a mixer 24. The mixer 24 is preferably of the conventional subtracting superheterodyne type and forms its mixed output signal $S_M$ as a periodic signal having a frequency equal to the difference in frequencies of its two input signals. Such frequency translation devices as the mixer 24 are well known in the art and may be either passive or active, diode or transistor, FET or dual-gate MOSFET devices, tubes, integrated circuits, Gilbert multipliers, etc., and may be balanced, singly balanced, doubly balanced, etc.

As is well known in the art, frequency translation devices such as the mixer 24 typically form their output signal as the product of two sinusoidal input signals, resulting in one sinusoidal output signal having a frequency equal to the sum of the frequencies of the input signals and another output signal having a frequency equal to the difference between the frequencies of the two sinusoidal input signals. The difference signal is the one utilized in the present invention, as is the case in almost all FM detection systems. The higher frequency sum signal is filtered out either by the mixer 24 or by subsequent filters in the FM IF stages. Frequency translation devices such as the mixer 24 are well known in the art and will therefore not be described further.

The FM detector according to the present invention also includes a filter 26. The filter 26 may be of a standard band-pass type such as a conventional low cost ceramic filter. The characteristics of the filter 26 will be described in greater detail below.

As in conventional FM detectors, the FM detector according to the present invention includes a frequency demodulator 28, preferably of a standard type, for demodulating its IF input signal. Examples of commonly used frequency demodulators which may be used as the frequency demodulator 28 include such frequency detection devices as a Travis detector, a Foster-Seeley style discriminator, a ratio detector, a quadrature detector, a charge-coupled detector, a pulse-counting detector, etc. As is well-known in the art, the frequency-modulated input signal to such a frequency demodulator is converted into an amplitude, or current strength modulated signal suitable for driving audio devices. In audio applications, the output signal $S_R$ from the FM demodulator 28 is passed as an input signal to a conventional audio driver 32 for driving a speaker 34. As was mentioned above, the system illustrated by way of example in FIG. 1 is provided for converting an FM broadcast signal into an audible signal. The audio driver 32 has been included in FIG. 1 only to illustrate a complete FM radio system and is of course not necessary in applications of the present invention such as radar which do not necessarily produce an audio output.

The present invention is not restricted to systems designed to produce an audio output, such as an FM radio, and for that reason the antenna 20, the driver 32, and the speaker 34 will not be mentioned in further detail.

In the following description of the present invention, the forward signal path is defined as the signal path from the output of the front end 22 to the output of the frequency demodulator 28.

The output signal $S_R$ from the FM demodulator 28 is also connected as one input signal to a local source of frequency modulated signals, such as an oscillator 36. The oscillator 36 may be of a conventional type often referred to as a local oscillator or a voltage controlled oscillator ("VCO"). The output signal $S_R$ from the frequency demodulator 28 is thus fed back to the local oscillator 36 and will correspond to the demodulated deviation of the input signal to the frequency demodulator 20. The local oscillator 36 has an idle frequency $f_L$, which is deviated by the return signal $S_R$.

The construction and operation of a VCO such as the local oscillator 36 are well known in the art and will therefore not be described further. It is sufficient to 36 is in a frequency band centered at $f_L$ with a deviation corresponding to $S_R$. As shown in FIG. 1, $S_L$ is therefore in the band $f_L \pm \Delta f_L$. The output signal $S_L$ from the local oscillator 36 forms the second input signal to the mixer 24. Since the mixer 24 is preferably of the subtraction type, the signal path from the output of the frequency demodulator 28 via the local oscillator 36 and to the mixer 24 forms a negative feedback path for the present FM detector. As is shown in FIG. 1, a limiter 38 is also included in the forward signal path, receiving as its input signal the output signal from the filter 26 and delivering its output signal as the input signal to the frequency demodulator 28. The limiter 38 may comprise any conventional amplitude limiter such as is typically used in FM systems to eliminate AM interference. As will be pointed out below, the limiter 38 is not essential to the present invention and its inclusion is therefore optional.

Unique to the present invention is, however, a harmonics generator 40, which receives the mixer output signal $S_M$ as its input signal and delivers an output signal $S_H$ as the input signal to the filter 26. As will be explained below, the position of the harmonics generator 40 in the forward signal path may be varied. In all embodiments described below, however, the harmonics generator 40 generates $S_H$ with a frequency spectrum consisting primarily of the harmonics, preferably of odd order, of its input signal $S_M$. Examples of devices which may be used as the harmonics generator 40 are active or passive devices such as an over-driven tube, FET, transistor, clipping diodes, a comparator, a Schmitt trigger, etc. In the present discussion, it will be assumed that for each sinusoidal input signal component the harmonics generator 40 generates $S_H$ as a square-wave output signal having a frequency equal to its mainly sinusoidal input signal. The advantage of a square-waved output signal is that it is rich in odd harmonics. As will become apparent below, however, any harmonics generator generating an output spectrum including the harmonics of its input signal may be used according to the present invention.

It will be assumed in the discussion of the present invention that all necessary amplifiers are included in the detection circuitry. Those skilled in the art will readily understand the need for amplification and the proper methods and devices needed to attain it. The principles of operation of the present invention are independent of signal amplitude and for the sake of clarity, amplification circuitry is not shown or described.

Figure 2:
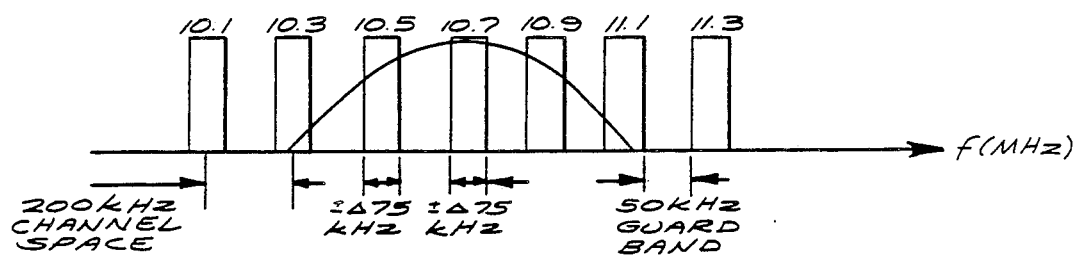
FIG. 2 illustrates an FM carrier spectrum and a filter characteristic according to the prior art.

FIG. 2 illustrates standard IF frequency bands. Once again, for the sake of simplicity only, all frequency bands are shown as having the same amplitude. This uniformity of amplitude is, however, irrelevant to the present invention. In FIG. 2, the standard tuned carrier has the accepted international standard center frequency of 10.7 MHz. In all, FIG. 2 shows seven carrier, three on either side of the center frequency. Each frequency band has a deviation of $\pm \Delta 75$ kHz on either side of its center frequency. The channel space, that is, the frequency difference between adjacent therefore a 50 kHz guard band between each adjacent pair of frequency bands.

The IF carriers other than the tuned carrier are referred to below as side carriers. The IF frequency bands centered closest in frequency 200 kHz on either side of the 10.7 Mz tuned carrier band at 10.7 MHz, that is, in FIG. 1, the frequency bands centered at 10.5 MHz and 10.9 MHz, are referred to below as the adjacent carriers; all other carriers are referred to as alternate carriers. For the purpose of understanding the present invention, one should simply note that each of the carriers has a uniform deviation of $\pm \Delta 75$ kHz, and that the carriers are uniformly distributed with a 200 kHz channel space. The prior art frequency spectrum shown in FIG. 2 is the frequency spectrum which appears at the output of the RF/IF converter 22, i.e., FIG. 2 shows the spectrum of $S_I$.

The curved line shown in FIG. 2 illustrates a response curve for a typical band-pass filter used in prior art detection systems. This filter may for example comprise the LC or ceramic filters, or a combination of these, found in prior art FM receivers. This characteristic response curve also illustrates a characteristic problem of prior art FM receivers. Although the center frequency of the band-pass filter is naturally chosen to be the center frequency of the tuned carrier, the pass band is not sufficiently narrow to filter out severe interference from the adjacent carriers and a significant interference from the alternate carriers. This of course illustrates the reason why prior art solutions attempt to increase the selectivity of the filters by narrowing the pass band. As was discussed above, this prior art approach require more and more complicated and expense filters. The present invention achieves much better selectivity by using a completely different approach.

Figure 3:
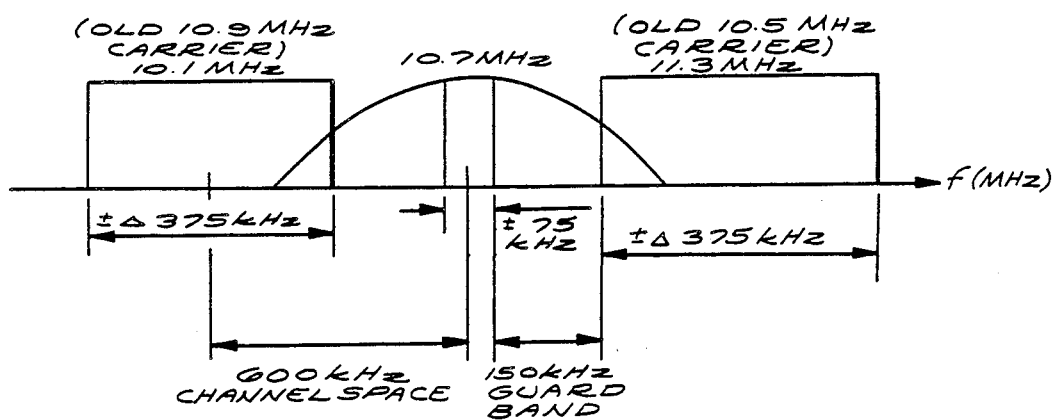
FIG. 3 illustrates the fundamental novel principle employed by the present invention.

FIG. 3 illustrates the new approach taken by the present invention. Referring also to FIGS. 1 and 2, whereas FIG. 2 illustrates the frequency spectrum of $S_I$ found at point A before the mixer 24 in FIG. 1, FIG. 3 illustrates one example of an achievable frequency spectrum at the output of the harmonics generator 40, i.e., of $S_H$. Comparing FIGS. 2 and 3, one sees that the tuned carrier centered at 10.7 MHz is unaltered and retains its deviation of $\pm \Delta 75$ kHz. The adjacent carrier band centered at 10.9 MHz in FIG. 2 has in FIG. 3 has been shifted away to have a center frequency of 10.1 MHz, and its deviation has been increased to $\pm \Delta 375$ kHz. The adjacent carrier band centered in FIG. 2 at 10.5 MHz has in FIG. 3 been shifted away to have a center frequency 11.3 MHz, and its deviation has likewise been increased to $\pm \Delta 375$ kHz. The channel space has been increased from the previous 200 kHz to a value of 600 kHz. The guard band has likewise been increased by a factor of three from the previous 50 kHz to 150 kHz. In other words, using the principles of the present invention to be described in greater detail below, adjacent carriers are "multiplied away" from the 10.7 MHz tuned carrier. In FIG. 3, the multiplication or expansion factor is three.

The curved line shown in FIG. 3 represents the same filter response curve shown in FIG. 2. Operating on the signal spectrum shown in FIG. 3, because of the greatly increased guard band, the band-pass filter now is able to eliminate almost all interference from the adjacent carriers even when they exhibit maximum deviation and high signal strength; alternate carriers, which now lie much further away in frequency from the tuned carrier, are essentially completely filtered out. The severe interference from adjacent carriers and the significant interference from the alternate carriers in prior art FM systems is almost completely eliminated by the existing filter when used in the FM detection system according to the present invention. As will be explained below, using the present invention, it is now possible to achieve even greater improvement in selectivity and, therefore, performance than is illustrated in FIG. 3.

FIG. 4 is a block diagram showing simple yet fully functional embodiment of the present invention. Since the present invention is applicable to all frequency modulated filtering systems, the components shown in FIG. 1 which were particularly related to FM radio reception and reproduction have not been included in FIG. 4. Components common to both FIG. 5 and FIG. 1 have retained the same reference numerals. In the description of the preferred embodiments, it will be assumed that the tuned IF carrier has a center frequency of 10.7 MHz and a deviation of $\pm \Delta 75$ kHz. The tuned carrier is naturally only one component of the input signal $S_I$ to the mixer. The uppermost frequency spectrum shown in FIG. 5 represents the input signal $S_I$ to the mixer 24 at point A in FIG. 4. It will be seen that this is the same spectrum as was shown in FIG. 2.

As was described above, the output signal $S_L$ from the local oscillator 36 comprises a second input signal to the mixer 24. The mixer 24 therefore also constitutes a feedback junction in the present system. In the embodiment shown in FIG. 4, $S_L$ has a center frequency of 12.84 MHz and a deviation of $\pm \Delta 60$ kHz. As is well known in the art, the deviation of $S_L$ is a function of the return signal $S_R$ which is generated as the output signal from the FM demodulator 28. According to the present invention, the local oscillator 36 is tuned in a known manner so that the deviation of its output signal $S_L$ is "in phase" with the $\pm \Delta 75$ kHz tuned carrier signal, which is included in the other input signal $S_I$ to the mixer 24. In other words, when the deviation of the tuned carrier signal is zero, the deviation of the output signal $S_L$ is also zero; when the deviation of the tuned carrier signal is positive (negative), the deviation of the output signal $S_L$ is also positive (negative). Furthermore, the local oscillator 36 is tuned so that the deviation of its output signal $S_L$ reaches its maximum value of $+\Delta 60$ kHz approximately at the same time as the deviation of the tuned carrier signal reaches its maximum value of $+\Delta 75$ kHz. Similarly, the deviation of the output signal $S_L$ reaches its maximum value of $-\Delta 60$ kHz approximately at the same time as the deviation of the tuned carrier signal reaches its maximum value of $-\Delta 75$ kHz.

FIG. 1 illustrates a second embodiment of the present invention. The sole difference between the second embodiment and the first embodiment shown in FIG. 4 is that the second embodiment includes the limiter 38 between the filter 26 and the frequency demodulator 28. As was pointed out above, the limiter 38 is not essential to the present invention and is shown only as an example of what is accepted design practice in the art. The inclusion of the limiter 38 is a design choice which is solely dependent on which type of frequency demodulator is chosen for the system. Some types of frequency demodulators are more immune to AM interference and will not require the limiter 38 at all. Accordingly, it is to be assumed in the following discussion of the various embodiments of the present invention that one or more limiters such as the limiter 38 may be included in the present FM detector. The inclusion of a limiter will normally not affect the performance or signal characteristics of the present FM detector in any significant way.

In FIGS. 1 and 4, point A is at the input of the mixer 24, between the front end 22 and the mixer 24 and includes the tuned carrier input signal. Point B is at the output of the mixer 24, and point C is at the output of the harmonics generator 40. FIG. 5 shows representative frequency spectra at points A, B and C in the first and second embodiments. In FIG. 5, the uppermost frequency spectrum shows the distribution, deviation and spacing of the unprocessed IF carriers. It will be observed that this frequency spectrum is the same as was shown in FIG. 2. Specifically, the tuned carrier has a center frequency of 10.7 MHz and a deviation of $\pm\Delta 75$ kHz. The channel space between carriers is 200 kHz and the guard band separating the carriers is 50 kHz wide.

The middle frequency spectrum in FIG. 5 shows the result of mixing the carrier input signal $S_I$ with the output signal $S_L$ from the local oscillator 36 by the mixer 24. In accordance with the well-known principles of superheterodyne down conversion, each original carrier shown in the upper spectrum in FIG. 5 is shifted downward so that its converted center frequency is equal to the absolute value of the difference between its original center frequency and the center frequency of the output signal $S_L$ from the local oscillator 36. Accordingly, the tuned carrier having a center frequency of 10.7 MHz is shifted downward in frequency so that its center frequency after mixing by the mixer 24 is (12.84−10.7) MHz 2.14 MHz. Because the deviation of the output signal from the local oscillator 36 is in phase with the deviation of the tuned carrier, the deviation of the mixed tuned carrier is equal to $(\pm\Delta 75 - \pm\Delta 60)$ kHz $= \pm\Delta 15$ kHz. On the other hand, because the deviation of the output signal $S_L$ is generally not in phase with the deviations of the adjacent and alternate carriers, the adjacent and alternate carriers, after downward conversion by the mixer 24, may have a worstcase deviation of $\pm\Delta 135$ kHz.

For full understanding of the present invention, one should recall that down conversion by a mixer such as the mixer 24 does not affect channel spacing. Consequently, the channel spacing at point B is the same as the channel spacing at point A, that is, 200 kHz. Because of the increased deviation of the adjacent and alternate carriers, however, there will in the worst case be some overlapping of these carriers. As will become apparent, this overlapping of adjacent and alternate carriers does not in any way degrade the greatly improved performance of the present invention. The reason for this is that, because the deviation of the tuned carrier is reduced to $\pm\Delta 15$ kHz, there is the adjacent carriers directly after mixing by the mixer 24.

The bottommost frequency spectrum in FIG. 5 illustrates the effect of processing by the harmonics generator 40 of the mixer output signal $S_M$ at point B. It will be recalled that the output signal $S_H$ from the harmonics generator 40 (at point C) contains the preferably odd harmonics of its input signal (at point B). In the first and second embodiments, it will be assumed solely for the sake of illustration that the fifth harmonic of each corresponding input signal is chosen. Because the generation of harmonics is equivalent to a frequency multiplication, the spectrum shown in FIG. 5 for the signal at point C represents a five-fold expansion of the frequency spectrum of the signal at point B. Accordingly, by selecting the fifth harmonic of the alternate carrier centered at 1.74 MHz at point B, this alternate carrier is mapped onto a band centered at 8.7 MHz; of course, its deviation of $\pm\Delta 135$ kHz will also be increased by a factor of five to $\pm\Delta 675$ kHz. The same expansion by a factor of five of course applies to the other carriers as well, including the tuned carrier which, at point B, is at 2.14 MHz $\pm\Delta 15$ kHz. The tuned carrier is therefore converted upward in frequency to its pre-mixed value of 10.7 MHz $\pm\Delta 75$ kHz. The multiplication process carried out by the harmonics generator 40 therefore exactly reproduces the original IF tuned carrier.

Comparing the spectra at points B and C in FIG. 5, one should note that the channel space of 200 kHz at five to become 1.0 MHz. Similarly, the guard band between the tuned carrier and each adjacent carrier is increased by a factor of five from 50 kHz to 250 kHz. This means that at point C, not only have the adjacent carriers been shifted away from the desired 10.7 MHz tuned carrier by a factor of five, but the guard band between the tuned carrier and these adjacent carriers has also been increased fivefold. This expansion of the frequency spectrum has been accomplished without altering the tuned carrier. As was pointed out in the discussion of FIG. 3 above, this means that the potential for interference from even the closest carrier bands is greatly reduced. Existing filters for selecting the tuned carrier such as the filter 26 will therefore pass far less of any potentially interfering carrier than was possible according to the prior art.

Exact reproduction of the 10.7 MHz $\pm\Delta 75$ kHz tuned carrier by the harmonics generator 40 follows from the fact that the difference between the 12.84 MHz $\pm\Delta 60$ kHz output signal $S_L$ from the local oscillator 66 and the 10.7 MHz $\pm\Delta 75$ kHz tuned carrier is equal to one-fifth of the tuned carrier signal. In essence, the mixer 24 therefore divides the tuned carrier input signal by a factor of five, and the harmonics generator 40 simply multiplies by a factor of five to return the signal to its original characteristics.

Stated in general terms, let $S_I$ designate the tuned carrier input signal, and let n represent the multiplication or expansion factor (i.e. the harmonic selected) of the harmonics generator 40. The combined operations of the of the harmonics generator 40 and the mixer 26 then exactly reproduce the tuned carrier. The local oscillator 66 is preferably scaled and tuned so that the output signal $S_L$ is such that $ABS(f_i/(f_L - f_i))$ and $ABS(-\Delta f_i/(\Delta f_L - \Delta f_i))$ are both equal to n, where ABS is the absolute value operator. This relationship is, however, not strictly required according to the present invention; other design choices are equally possible, although they would require corresponding adjustment of the frequency-dependent components such as the filter 26 and the frequency demodulator 28.

Figure 6:
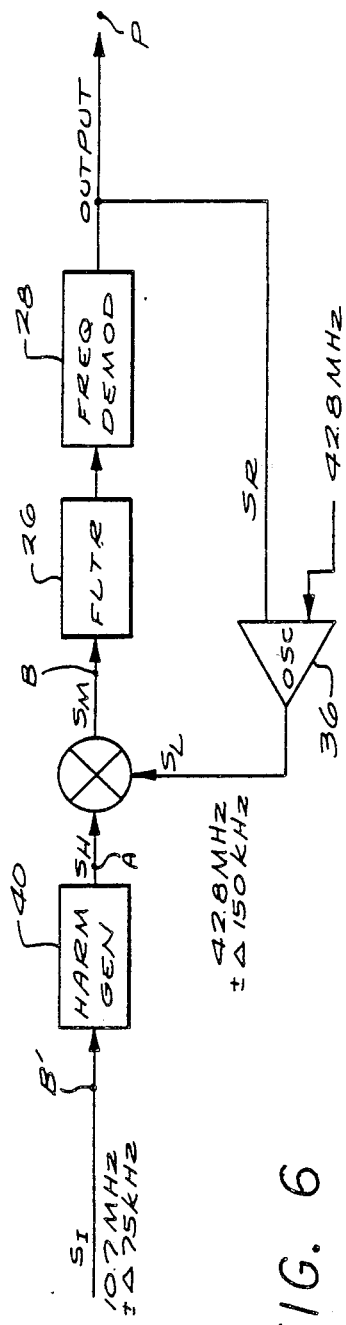
FIGS. 6 and 7 are schematic block diagrams of a third and fourth embodiment, respectively, of the present FM detector.
Figure 7:
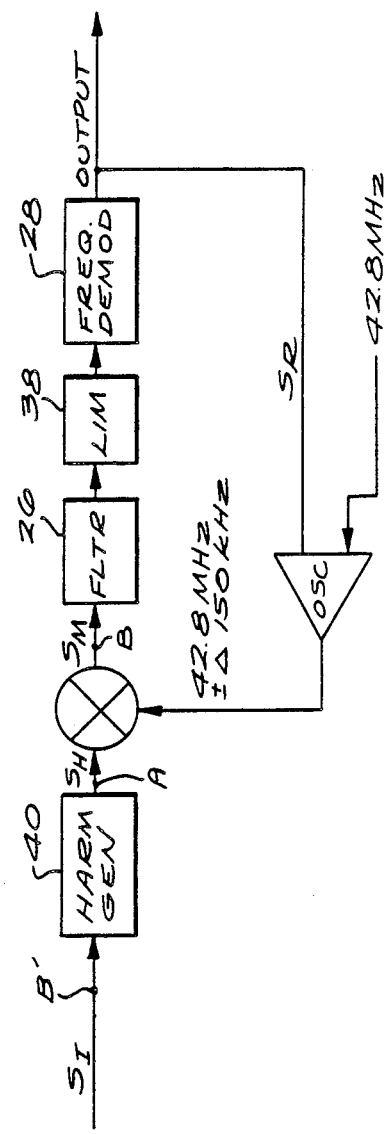

FIGS. 6 and 7 illustrate respectively a third and fourth embodiment of the present invention. The only difference between the third and fourth embodiments is the inclusion of the limiter 38 in the fourth embodiment. As was discussed above, the limiter 38 is a design option and is not essential for the proper functioning of the present invention. Consequently, the following explanation of the third embodiment shown in FIG. 6 is also valid for the fourth embodiment shown in FIG. 7.

The third and fourth embodiments of the present invention differ structurally from the above-described first and second embodiments only in that the harmonics generator 40 is provided before the mixer 24 in the forward signal path. As FIG. 6 illustrates, the input carrier signal $S_I$ forms the input signal to the harmonics generator 40 and the output signal $S_H$ from the harmonics generator forms the first input signal to the mixer 24. As before, the tuned carrier has a center frequency of 10.7 MHz and a deviation of $\pm\Delta75$ kHz. In the third and fourth embodiments, the local oscillator 36 is tuned so that its output signal $S_L$ has a center frequency of 42.8 MHz and a deviation $\pm\Delta150$ kHz. As before, the output signal $S_L$ forms the second input signal to the mixer 24.

In FIG. 8, the uppermost graph illustrates the spectrum of the carrier input signal $S_I$, i.e., the signal spectrum at point B' in FIGS. 6 and 7. The characteristics of the carrier input signal $S_I$ have been described above and are in FIGS. 6 and 7 the same as the corresponding spectrum shown in FIG. 5. The middle frequency spectrum in FIG. 8 shows the spectrum of the output signal $S_H$ from the harmonics generator 40, i.e., the signal spectrum at point A. In the third and fourth embodiments, it is assumed for the sake of illustration only that the harmonics generator 40 selectively generates and extracts third harmonics. In other words, the multiplication or expansion factor n used in the third and fourth embodiments is chosen to be three. Since the third harmonic of each input frequency component of $S_I$ is generated by the harmonics generator 40, the frequency spectrum at point A will simply represent a three-fold multiplication of the frequency spectrum at point B' for the carrier bands.

Comparing the upper and middle spectra in FIG. 8 one sees that the original 10.7 MHz $\pm\Delta75$ kHz IF tuned carrier is converted by the harmonics generator 40 into a 31.5 MHz $\pm\Delta225$ kHz frequency band. The center frequency and deviation of each side carrier is likewise multiplied by three. Since the multiplication process performed by the harmonics generator 40 is frequency independent, the 200 kHz channel space and the 50 kHz guard band between any pair of carriers is also multiplied by three so that the channel space at point A is 600 kHz and the guard band is 150 kHz.

The output signal $S_H$ from the harmonics generator 40, whose spectrum is shown for point A in FIG. 8, is mixed by the mixer 24 with the output signal $S_L$ from the local oscillator 36. As before, the local oscillator is tuned so that its $\pm\Delta150$ kHz deviation is in phase with the deviation (here, $\pm\Delta225$ kHz) of the tuned carrier. The output signal $S_L$ will therefore reach its maximum positive and negative deviation at the same time as the corresponding tuned carrier input signal reaches its maximum positive and negative deviations, respectively.

The bottommost spectrum shown in FIG. 8 illustrates the spectrum of the output signal $S_M$ from the mixer 24 in the third and fourth embodiments (see FIGS. 6 and 7). The mixed output signal $S_M$ at point B is therefore the result of the mixing of the output signal $S_H$ from the harmonics generator 40 and the output signal $S_L$ from the local oscillator 36. Considering first the effect of mixing on the side carriers, one sees that the center frequency of each side carrier is reduced by an amount equal to the absolute value of the difference between its premixed center frequency (at point A) and the center frequency of the output signal $S_L$ of 42.8 MHz. For example, the adjacent carrier centered at point A at 32.7 MHz is converted downward to have a center frequency of $(42.8-32.7)$ MHz $=10.1$ MHz.

Because the deviation of the output signal $S_L$ is generally not in phase with the deviations of the adjacent and alternate carriers, the deviation of each adjacent and alternate carrier after mixing may be increased to a worst-case value of $\pm\Delta150 \pm\Delta225$ kHz $=\pm\Delta375$ kHz. Because the deviation of the output signal $S_L$ is in phase with the deviation of the tuned carrier, the maximum deviation of the corresponding tuned carrier after mixing by the mixer 24 is $\pm\Delta225 -(\pm\Delta150)=\pm\Delta75$ kHz. Since the mixing process does not alter the channel space of 600 kHz, there is therefore a 150 kHz guard band between the post-mixed 10.7 MHz tuned carrier and the post-mixed adjacent 10.1 and 11.3 MHz adjacent carriers.

As before, the multiplication and mixing processes according to the present invention have exactly reproduced the original 10.7 MHz $\pm\Delta75$ kHz tuned carrier and have increased the guard band between the tuned carrier and the nearest potential interfering adjacent carriers by a factor equal the multiplication factor n (the chosen harmonic) of the harmonics generator 40. As before, the tuned carrier is therefore much more greatly isolated from any potential interfering carrier than was possible according to the prior art. Even using a given known filter as the filter 26, the selectivity of the present FM detector is therefore greatly improved compared to prior art detection systems, since nearby interference carriers are "shifted away" from the tuned carrier.

Comparing the first and third embodiments, one sees that the multiplication operation carried out by the harmonics generator 40 may be performed before or after the mixing operation of the mixer 24 with the same resulting n-fold increase in separation between the tuned carrier and all side carriers. In both cases, the result is achieved by a manipulation of the deviation of each carrier. In providing the harmonics generator 40 before the mixer 24 in the forward signal path, it is only necessary to re-tune the local oscillator 36 in a well-known manner.

Figure 10:
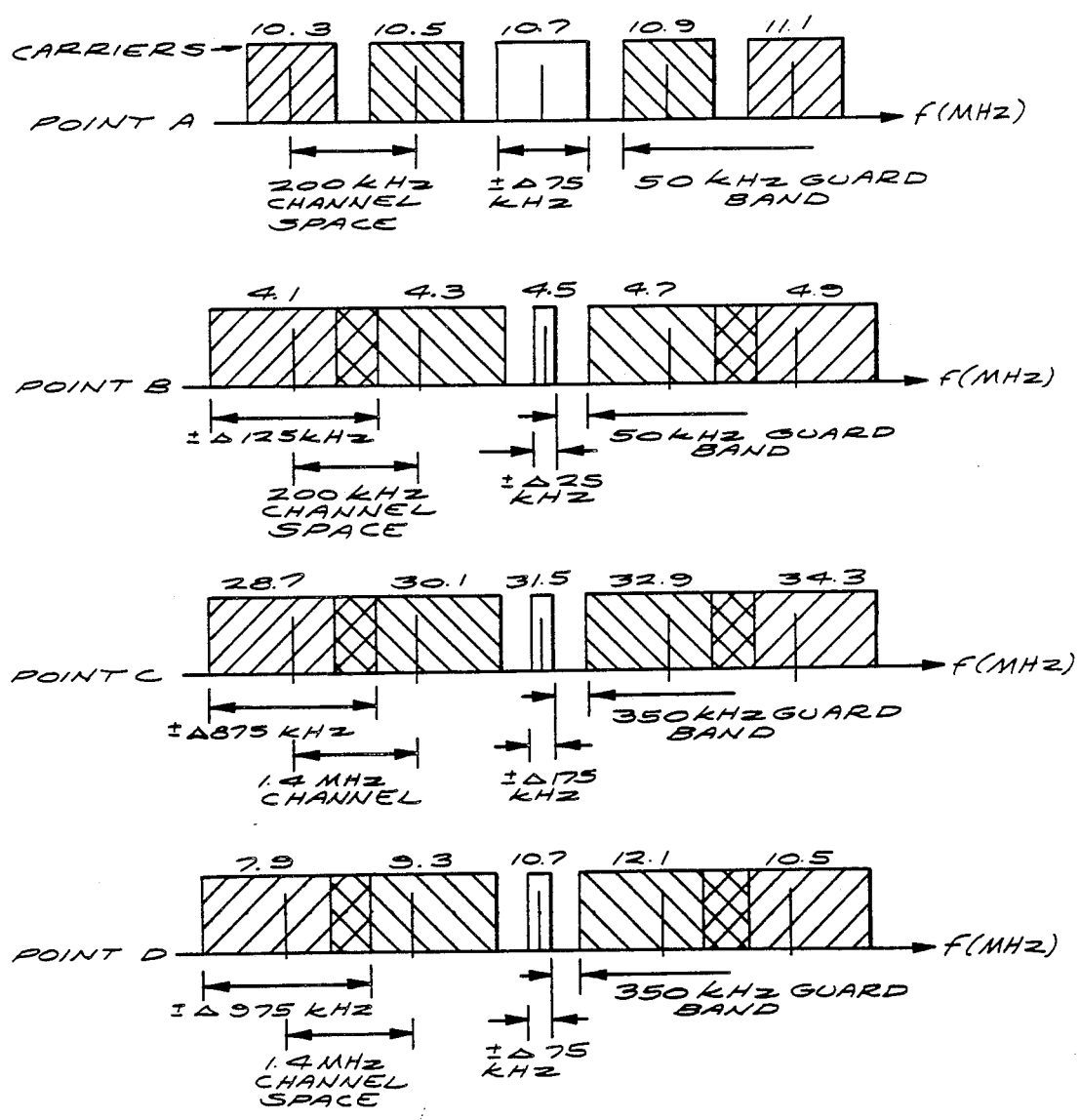
FIG. 10 shows representative frequency spectra at chosen points in the fifth embodiment.

FIG. 9 illustrates a fifth embodiment of the present invention. FIG. 10 illustrates signal frequency spectra at points A, B, C and D in FIG. 9. The spectrum of the input carrier signal $S_I$ at point A is the same as for the previous embodiments. The fifth embodiment includes two mixers—a first mixer 42 and a second mixer 46. The mixers 42 and 46 may be of the same type as the previously described mixer 24. In the fifth embodiment, the harmonics generator 40 is located directly after the first mixer 42 in the forward signal path so that the mixed output signal $S_{M1}$ from the first mixer 42 (at point B) constitutes an input signal to the harmonics generator 40.

The fifth embodiment also includes two filters - a first filter 44 and a second filter 48. The output signal $S_H$ from the harmonics generator 40 (point C) constitutes an input signal to the first filter 44. The output signal from the first filter 44 constitutes a first input signal to the second mixer 46. The second mixed output signal $S_{M2}$ from the second mixer 46 (point D) constitutes an input signal to the second filter 48. The output signal from the second filter 48 constitutes the input signal to the frequency demodulator 28.

As before, the output signal from the frequency demodulator 28 is returned as the return signal $S_R$, but in the fifth embodiment it is used to control two local oscillators—a first local oscillator 50 and a second local oscillator 52. An output signal $S_{L1}$ from the first local oscillator is centered at 6.2 MHz with a deviation of $\pm\Delta 50$ kHz. An output signal $S_{L2}$ from the second local oscillator 52 is centered at 20.8 MHz and has a deviation of $\pm\Delta 100$ kHz. The output signal $S_{L1}$ forms a second input signal to the first mixer 42. The output signal $S_{L2}$ forms a second input signal to the second mixer 46. The first and second local oscillators 50 and 52, respectively, are as before tuned in a known manner so as to deviate in phase with the 10.7 MHz $\pm\Delta 75$ kHz tuned carrier input signal.

As shown in FIG. 10 for point B, each original IF carrier contained in the carrier input signal $S_I$ is mixed downward so that its post-mixed center frequency is equal to the absolute value of the difference between its pre-mixed center frequency and the 6.2 MHz center frequency of $S_{L1}$. The 10.7 MHz tuned carrier is therefore mixed down by the mixer 42 to have a center frequency of 4.5 MHz. Because the output signal $S_{L1}$ deviates in phase with the tuned carrier input signal, the deviation of the tuned carrier at point B will be reduced to $\pm(\Delta 75 - \Delta 50)$ kHz $= \pm\Delta 25$ kHz. Because the output signal $S_{L1}$ in general does not deviate in phase with the side carriers, the post-mixing deviations of these carriers may be increased to a worst-case value of $\pm(\Delta 75 + \Delta 50)$ kHz $\pm\Delta 125$ kHz. As before, the 200 kHz channel space remains invariant through the mixing process.

A multiplication or expansion factor of seven (i.e. n=7) is chosen by way of example in the fifth embodiment. Consequently, the harmonics generator 40 will generate the seventh harmonic of each of its input frequency components. The frequency spectrum shown for point C in FIG. 10 illustrates the result of the seven-fold frequency expansion by means of the harmonics generator 40. The results of frequency expansion on each carrier have been explained above. In the fifth embodiment, it is sufficient to note that the center frequency of each carrier is increased by a factor of seven from point B to point C, as is its deviation. The guard band is also increased by a factor of seven from its original value of 50 kHz to a value of 350 kHz at the output of the harmonics generator 40. The channel space is likewise increased to 1.4 MHz.

Unlike the embodiments of the present invention discussed above, the output signal $S_H$ from the harmonics generator 40 in the fifth embodiment does not include an exact reproduction of the 10.7 MHz $\pm\Delta 75$ kHz tuned carrier input signal. Instead, at point C in FIG. 9, the tuned carrier information is contained in a 31.5 MHz $\pm\Delta 175$ kHz band, also a result of seven-fold frequency multiplication of the first mixed output signal $S_{M1}$.

The output signal $S_H$ from the harmonics generator 40 forms an input signal to the first filter 44. The first filter 44 is preferably a conventional band-pass filter with its pass band centered at 31.5 MHz, that is, the center frequency of the tuned carrier band at point C after multiplication by the harmonics generator 40. Because of the greatly increased channel space and separation of the tuned carrier band from nearby potentially interfering carriers, the first filter 44 rejects potentially interfering carriers much more efficiently than was possible in the prior art.

The output signal from the first filter 44 is the first input signal to the second mixer 46. The second input to the second mixer 46 is the output signal $S_{L2}$ from the second local oscillator 52. The spectrum of the second mixed output signal $S_{M2}$ (at point D) from the second mixer 46 is illustrated in the bottommost frequency spectrum in FIG. 10.

Since the center frequency 31.5 MHz of the tuned carrier at point C is equidistant in frequency by 10.7 MHz from 20.8 MHz—the preferred idle frequency of the second local oscillator 52—the center frequency of the tuned carrier band after mixing by the second mixer 46 will be converted down to 10.7 MHz. As before, since the output signal $S_{L2}$ from the second local oscillator 52 deviates in phase with the tuned carrier signal, the corresponding deviation of the tuned carrier signal after mixing by the second mixer 46 will be equal to $\pm(\Delta 175 - \Delta 100)$ kHz $= \pm\Delta 75$ kHz. The second mixed output signal $S_{M2}$ thus includes an exact reproduction of the 10.7 MHz $\pm\Delta 75$ kHz tuned carrier input signal. The effect of the second mixing process on the side carriers is analyzed as in previous embodiments. It is sufficient to recall that the channel space remains invariant through mixing and at point D will be 1.4 MHz. Also, the guard band separating the tuned carrier from the nearest potentially interfering carrier remains at 350 kHz—a seven-fold improvement over the original guard band.

The output signal $S_{M2}$ from the second mixer 46 is filtered by the second filter 48. The second filter 48 is preferably of a conventional type having a pass band centered at 10.7 MHz. Because of the increased separation of the tuned carrier from potentially interfering carriers, the known filter 48, which may be of the inexpensive ceramic type, will provide vastly improved rejection of interfering carriers as compared with its possible performance in detection systems according to the prior art. The filtered output signal from the second filter 48 forms the input signal to the frequency demodulator 28. As before, the output signal from the frequency demodulator 28 passes forward to following circuitry such as an audio driver, and is also fed back as the return signal $S_R$ to control the deviation of the local oscillators 50 and 52, thereby closing the negative feedback loop.

Figure 11:
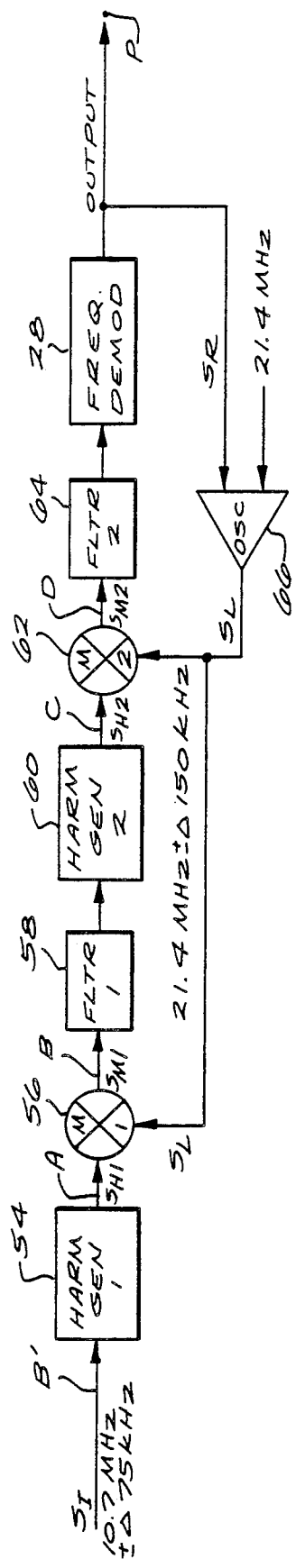
FIG. 11 is a schematic block diagram of a sixth embodiment of the present FM detector.

It is, in general, not advisable to increase isolation of the carrier band merely by increasing the multiplication or expansion factor n of a single harmonics generator beyond a factor of approximately seven. In the most common case, the harmonics generator will produce a square wave output having a period equal to the period of each sinusoidal input component. As is well-known from the theory of Fourier transforms, the amplitude of each harmonic will be proportional to the inverse of the number of the harmonic. If, for example, one were to attempt to select the 25th harmonic of the tuned carrier, the signal to be processed at the output of the harmonics generator would be reduced in amplitude by a factor of 25. This represents an undesirable worsening of the signal-to-noise ratio of the output signal from the harmonics generator. FIG. 11 is a block diagram of a sixth embodiment of the present invention, which illustrates a way in which the present invention provides higher degrees of frequency expansion without having to process high order harmonics. The principle to be used is that of cascading two or more lower-order expansion stages.

As shown in FIG. 11, the sixth embodiment includes a first harmonics generator 54 having the carrier input signal $S_I$ at point B' as its input signal and a first harmonic output signal $S_{H1}$ at point A as its output signal. The output signal $S_{H1}$ passes as a first input signal to a first mixer 56, which mixes the output signal $S_{H1}$ with the output signal $S_L$ from a local oscillator 66. A first mixed output signal $S_{M1}$ comprising the output from the first mixer 56 is injected into a first filter 58. The output from the first filter 58 is connected as the input to a second harmonics generator 60, whose output signal $S_{H2}$ at point C is a first input signal to a second mixer 62. The second mixer 62 mixes the output signal $S_{H2}$ with the output signal $S_L$ from the local oscillator 66 to yield a second mixed output signal $S_{M2}$, which is injected at point D as the input to a second filter 64. The output signal from the second filter 64 is the input signal to the FM demodulator 28.

As in previous embodiments, the output signal from the frequency demodulator 28 is fed forward to subsequent circuitry and is also fed back as the return signal $S_R$ to the local oscillator 66. The local oscillator 66 in this illustrative sixth embodiment generates its output signal $S_L$ with a center frequency of 21.4 MHz and a deviation of $\pm\Delta150$ kHz. As before, the output signal $S_L$ from the local oscillator 66 deviates in phase with the 10.7 MHz $\pm\Delta75$ kHz tuned carrier, the deviation being a function of the feedback signal $S_R$.

Figure 12:
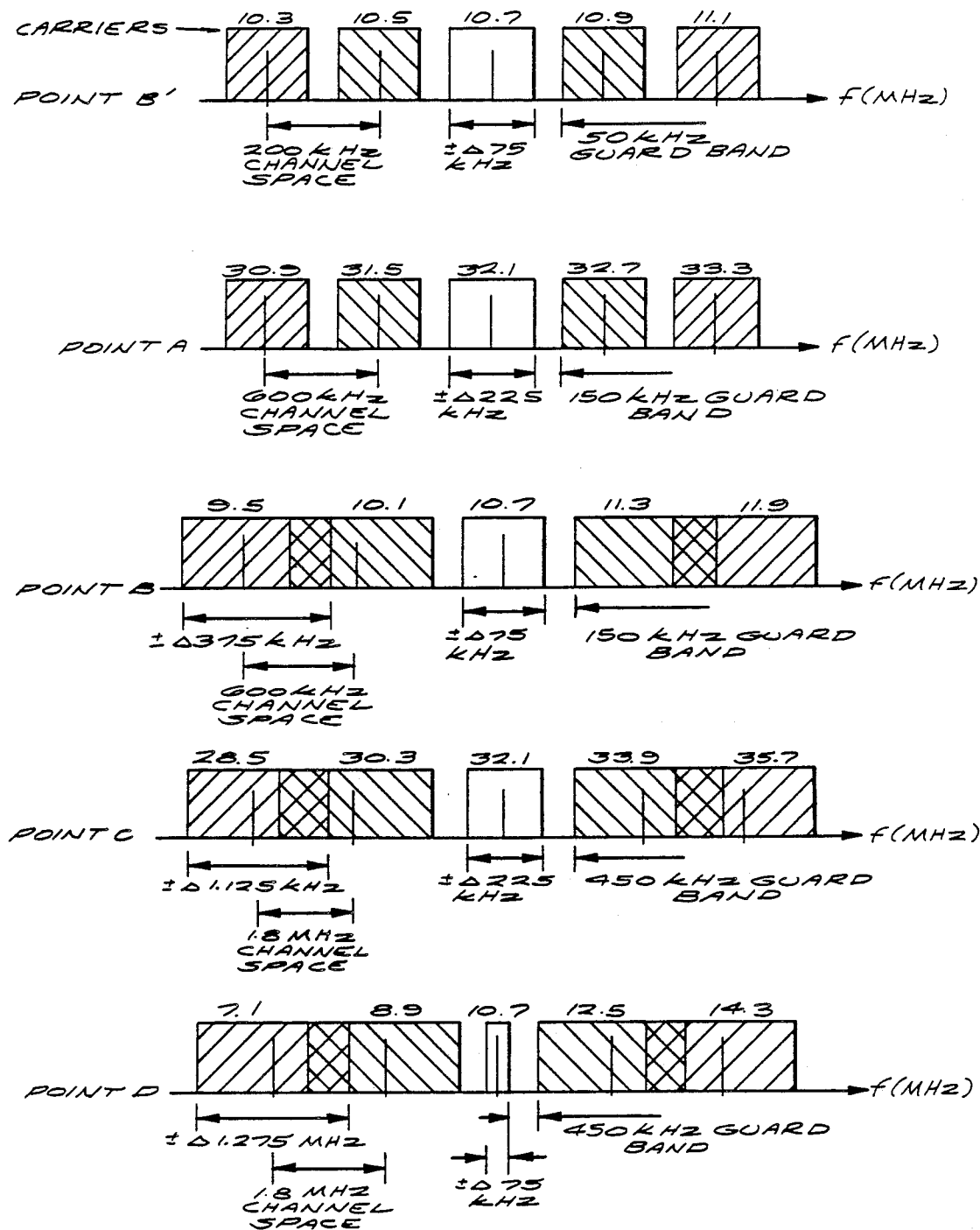
FIG. 12 shows representative frequency spectra at chosen points in the sixth embodiment.

FIG. 12 illustrates the frequency spectra at points B', A, B, C, and D in FIG. 11. The spectrum of the carrier input signal $S_I$ point B'is, of course, the same as has been described above. By way of example, the sixth embodiment will achieve a nine-fold frequency expansion by means of two cascaded three-fold expansion stages. Accordingly, the third harmonic of the respective input signal will be selected from both the first and second harmonics generators 54 and 64, respectively.

The first harmonics generator 54 multiplies its input spectrum by three (the third harmonic is selected), so that the frequency spectrum for the output signal $S_{H1}$ is as shown in FIG. 12 for point A. As before, the center frequencies, deviations, channel space and guard band for each carrier is multiplied by three. The output signal $S_{H1}$ is mixed with the 21.4 MHz $\pm\Delta150$ kHz output signal $S_L$ from the local oscillator 66. The output signal $S_M$ from the first mixer 56 will therefore have a spectrum as shown for point B in FIG. 12. As before, the in-phase deviation of the output signal $S_L$ relative to the tuned carrier reduces rather than increases the deviation of the tuned carrier by the mixing process.

As FIG. 12 shows, the tuned carrier is exactly reproduced by the first mixing process at point B; the guard band separating the tuned carrier from the nearest potentially interfering carriers has, however, been increased by a factor of three. The first filter 58, which, as before, may be a conventional band-pass filter having a center frequency of 10.7 MHz, filters the output signal $S_{M1}$ and, also as before, is able to reject unwanted carriers more efficiently due to the increased carrier separation. The output from the first filter 58 passes to the second harmonics generator 60, which generates an output spectrum corresponding to a three-fold multiplication of its input spectrum (the third harmonics are selected). This spectrum is shown for point C in FIG. 12. Because the harmonics generator will typically be a non-linear device such as a comparator, Schmitt trigger, etc., the amplitude of each output square wave will be the same regardless of the amplitude of the corresponding input sinusoidal signal as long as the amplitude of the latter is sufficiently great to trigger the harmonics generator.

The reduction in amplitude by a factor of three resulting from the previous harmonics generation will generally not be so great that the performance of the second harmonics generator 60 will be affected. The potential problem of a direct nine-fold decrease in amplitude is thus avoided. The output from the second harmonics generator 60 is similarly mixed by the second mixer 62 with the output signal $S_L$ from the local oscillator 66 to produce the second mixed output signal $S_{M2}$m, whose signal spectrum is shown (point D) in FIG. 12.

Since the second stage represents an additional frequency expansion by a factor of three, as is illustrated in FIG. 12, the channel space between carriers is increased from the original 200 kHz to 1.8 MHz, the original guard band of 50 kHz is similarly increased by a factor of nine to 450 kHz. As before, because of the in-phase deviation of the output signal $S_L$ from the local oscillator 66 and the tuned carrier, the tuned carrier is exactly reproduced at point D. The second filter 64 which, as the first filter 58, is preferably a band-pass filter of conventional type having a pass band centered at 10.7 MHz, will reject the nearest carriers at 8.9 MHz and 12.5 MHz and all other carriers much more efficiently than in the prior art.

Figure 13:
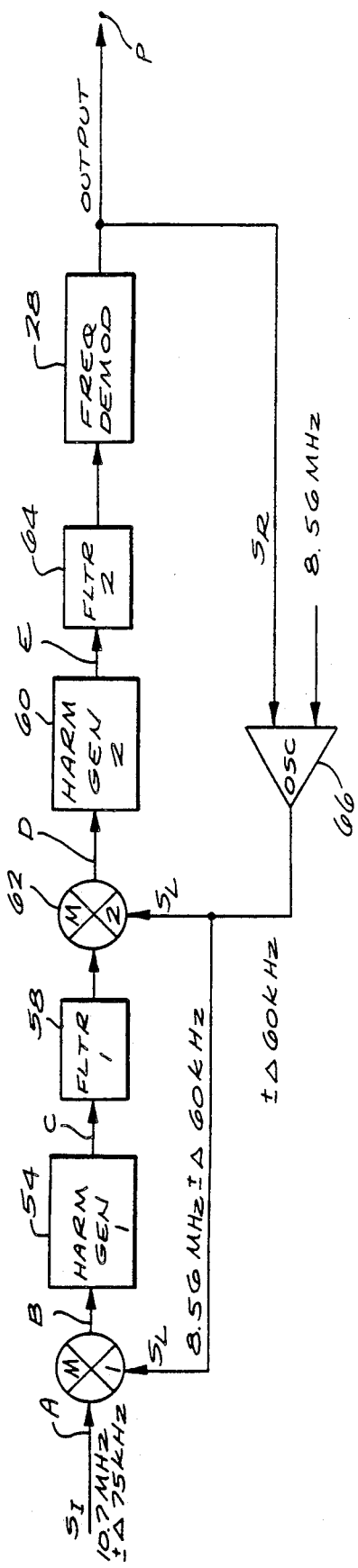
FIG. 13 is a schematic block diagram of a seventh embodiment of the present FM detector.

FIG. 13 illustrates a seventh embodiment of the present invention, in which a frequency expansion by a factor of twenty-five is achieved. This expansion is achieved by means of cascading two multiplication stages each having a frequency expansion factor of five. As will be explained below, this expansion by a factor of twenty-five approaches the upper limit of what may be practically achieved using the present inventive technique of deviation modification by means of spectrum expansion for FM detection in the standard commercial broadcast band. The components shown in FIG. 13 for the seventh embodiment are numbered the same as in the sixth embodiment shown in FIG. 11. This is done for the sake of simplicity only. Although the components may be identical in structure, it is to be understood that they will be re-tuned to correspond to the frequencies used in the seventh embodiment.

The fundamental structural difference between the sixth embodiment and the seventh is that the seventh embodiment as shown in FIG. 13 includes the harmonics generators in the forward signal path after their corresponding mixers, instead of before them as was the case in the sixth embodiment. It will be seen as before that this commutation does not affect the performance of the present invention in any way, but merely requires re-tuning the components.

Figure 14:
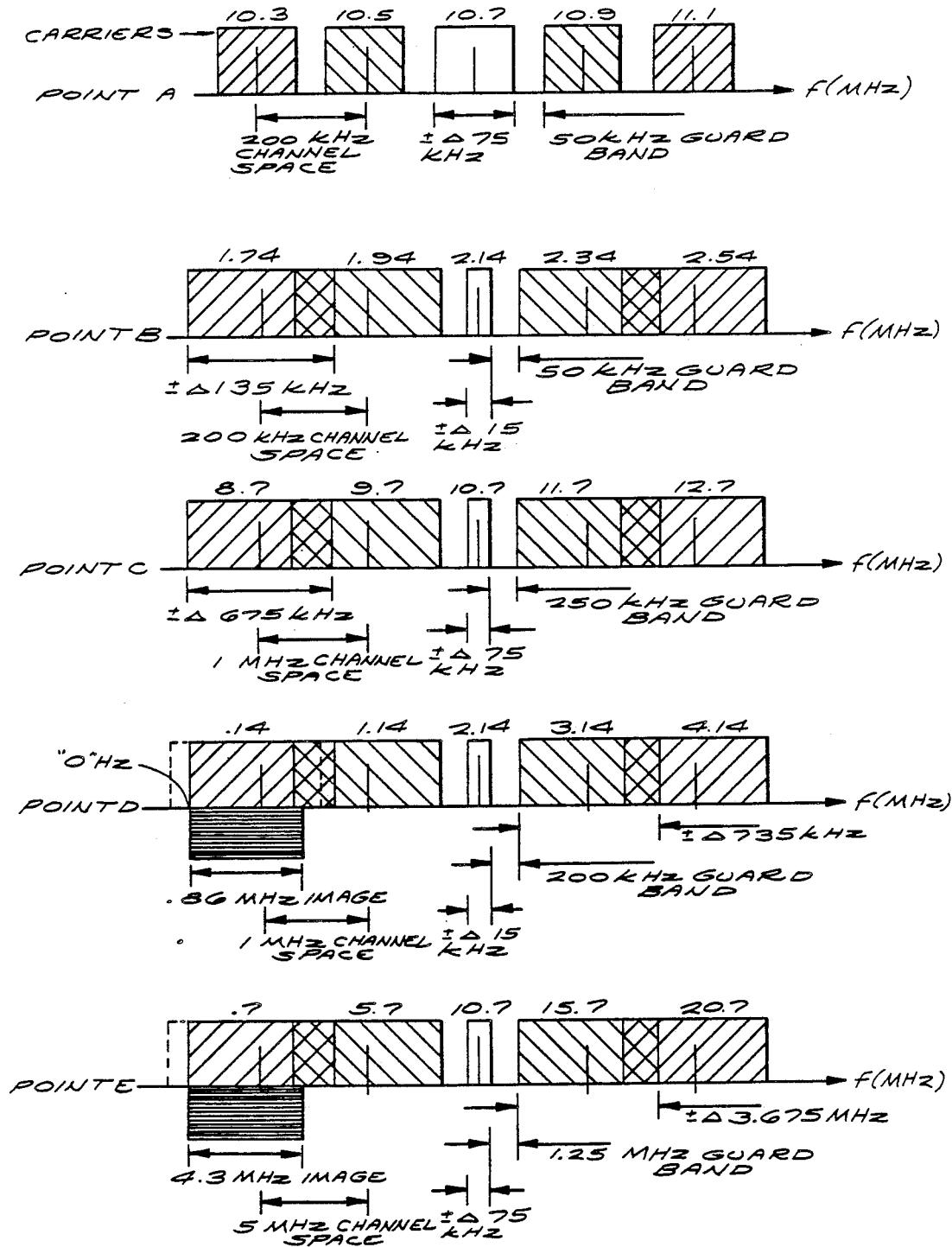
FIG. 14 shows representative frequency spectra at chosen points in the seventh embodiment.

FIG. 14 illustrates the spectra of the signals present at points A, B, C, D, and E in FIG. 13. As before, the carrier input signal includes the 10.7 MHz $\pm\Delta75$ kHz tuned carrier. The local oscillator 66 outputs a 8.56 MHz $\pm\Delta60$ kHz signal $S_L$, which deviates in phase with the tuned carrier, the degree of deviation being a function of the return signal $S_R$ from the frequency demodulator 28. In the seventh embodiment, each of the two harmonics generators 54 and 64, respectively, selectively generate the fifth harmonics of their respective input signals. The processing of the input signal from point A to B to C has been described above in conjunction with the discussion of other embodiments and will therefore not be repeated. It is sufficient to note that the first filter 58 will operate on a signal at point C including an exact reproduction of the tuned carrier, but with the guard band to the nearest carriers being increased by a factor of five to 250 kHz. The channel space will similarly be increased by a factor of five to 1.0 MHz.

Because of the greatly increased channel space, when the output signal from the first filter 58 is mixed a second time with the output signal $S_L$ from the local oscillator 66, certain carriers may theoretically be shifted downward to less than zero Hz. This is, of course, not realizable, and when this happens, the corresponding frequencies "fold over" and bleed back upwards into the positive frequency space. This is illustrated for the spectrum for point D in FIG. 14 by the image band shown extending below the frequency axis. When the signal at point D is expanded additionally by a factor of five by the second harmonics generator 60, the reflected or "folded over" frequency band will also be expanded by a factor of five. For the standard frequencies used in the seventh embodiment, no reflected image frequency band which bleeds up from the zero Hz level will extend into the 1.25 MHz guard band separating the 10.7 MHz $\pm\Delta75$ kHz tuned carrier from the 5.7 MHz and 15.7 MHz adjacent carriers. Detrimental interference would be possible if the multiplication factor would be increased further.

The improvement in selectivity made possible by the 25-fold increase in carrier separation in the seventh embodiment is a dramatic improvement compared to the prior art. The second filter 64, whose pass band is centered at 10.7 MHz, will be able to reject almost all of the undesired carriers. As in the previously-described embodiments, the filters 58 and 64 may therefore be conventional, inexpensive relatively wideband filters, but still achieve significantly greater selectivity than has been possible according to the prior art.

In the embodiments of the present invention described above, local oscillator frequencies are chosen so that when they are mixed with the tuned carrier, a corresponding post-mixed frequency band is generated having a center frequency equal to a whole fraction of the center frequency of the tuned carrier at the input to the mixer. This is convenient and therefore preferable since it simplifies tuning of subsequent filters and other components; it is, however, not necessary according to the present invention. Similarly, it is not necessary to use only odd harmonics, although this will also be the most convenient choice since square waves contain only odd harmonics. The principle of superheterodyne down conversion by mixing the tuned carrier with a local oscillator signal, which deviates in phase with it, followed or preceded by a multiplication by means of selecting harmonics, will remain the same regardless of which frequencies and harmonics are chosen.

Neither is the invention restricted to composite expansion factors, such as 9 or 25, which are the squares of odd whole numbers; it is, for example, possible to cascade a three-fold expansion stage with a five-fold expansion stage to achieve a fifteen-fold expansion. The numerous embodiments described above illustrate the great design flexibility made possible by applying the fundamental concept of deviation manipulation used in the present invention.

Using the present invention, it is now possible to achieve selectivity on the order hundreds of decibels with virtually no penalties in distortion, capture ratio, loss of separation, etc. Furthermore, this greatly improved performance is achieved using at most two conventional wide-band filters which may be of the inexpensive ceramic type.

Figure 15A:
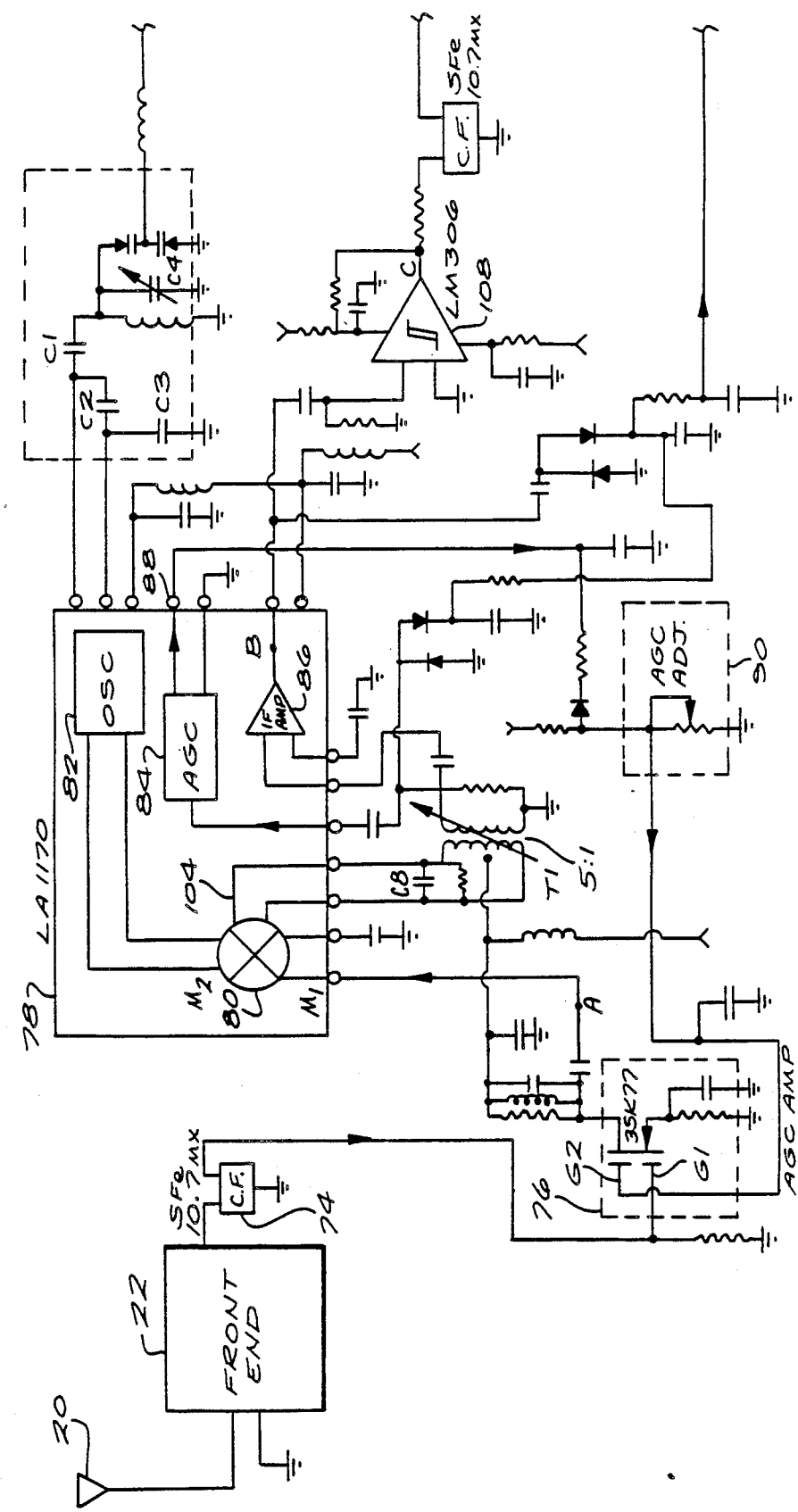
FIGS. 15A and 15B are a partially schematic circuit diagram of a prototype of the present invention whereby
Figure 15B:
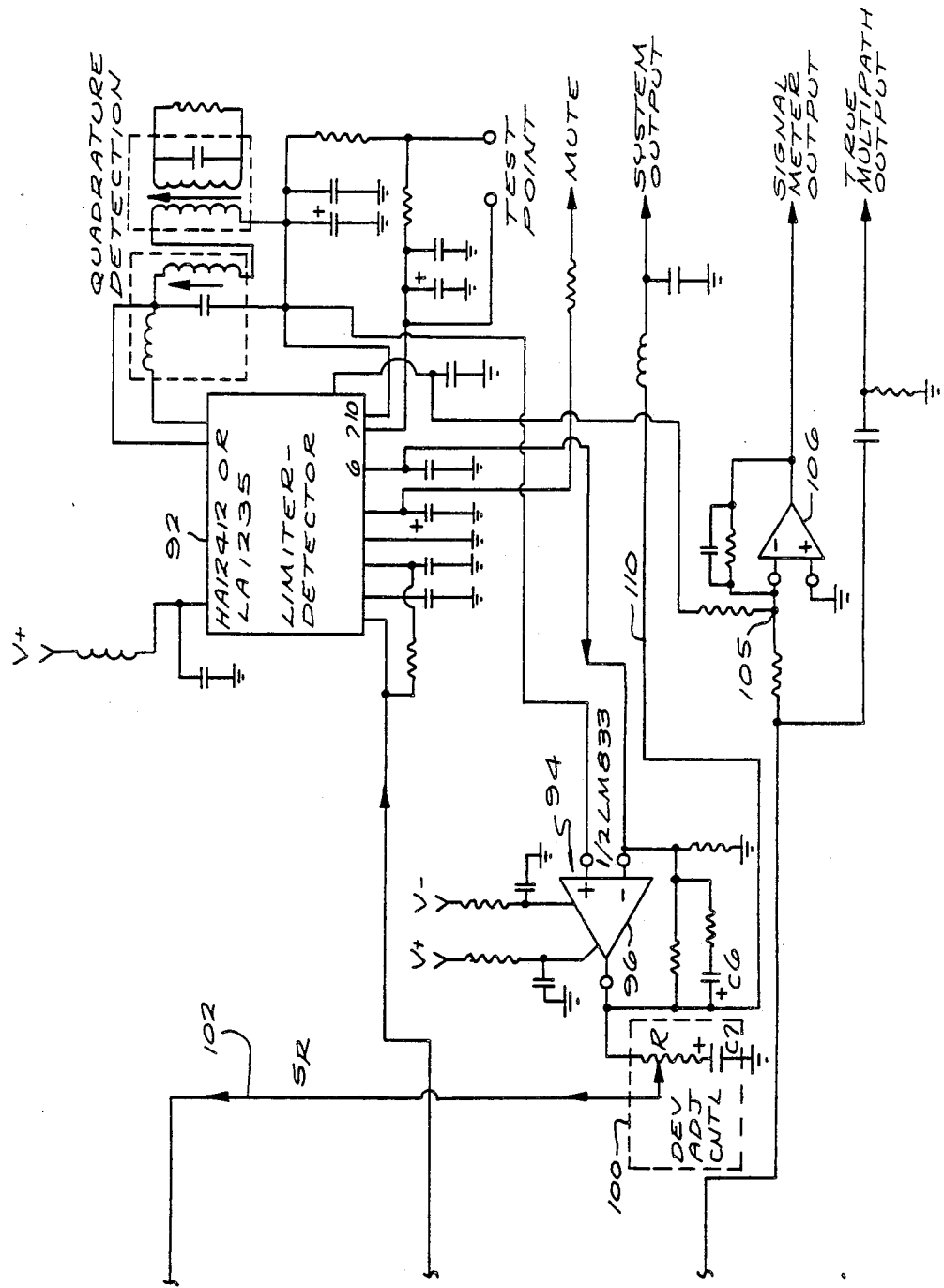

FIGS. 15A and 15B schematically show a practical embodiment of the present invention. FIG. 15B is a continuation of FIG. 15A. The practical embodiment shown in FIGS. 15A and 15B corresponds to the above-described second embodiment. Recall that the second embodiment is illustrated in FIG. 1, and that corresponding frequency spectra are shown for various points in FIG. 5. Where appropriate, reference numerals for corresponding components have been retained in FIGS. 15A and B from FIG. 1.

In the practical embodiment shown in FIGS. 15A and 15B, the antenna 20 receives a spectrum of carriers in the 88 MHz to 108 MHz FM broadcast band. In this band, the carriers are spaced 200 kHz apart, and the station deviations are at most $\pm\Delta75$ kHz, so that the guard band between carriers is at most 50 kHz wide. This input carrier spectrum is received by the antenna 20 and is injected as the input to the front end 22. The front end 22 may be of a traditional design with an RF amplifier, a superheterodyne mixer, and a local oscillator. As is well-known in the art, the front end 22 converts the tuned RF spectrum into an IF spectrum in 15 which the desired tuned carrier is centered at the internationally accepted standard frequency of 10.7 MHz. The output from the front end 22 is filtered by a ceramic IF filter 74, which may be of an SFe10.7 mx type or some similar filter. The filter 74 constitutes a pre-filter to the detection circuitry according to the present invention and may be considered part of the front end signal processing. The output of the filter 74 corresponds to the point A in FIG. 1.

The principal functions of the combination of the front end 22 and the filter 74 are to provide initial selectivity of the tuned carrier and to improve the rejection of the image frequency prior to subsequent superheterodyne conversion. Although no amplitude variations are shown in FIG. 5, it will be understood that, because of the band-pass filtering of the filter 74, the amplitude of the tuned carrier at point A will be significantly greater than the amplitudes of other carriers at the output of the filter 74. The dominating component of the output signal from the filter 74 will therefore be the 10.7 MHz $\pm\Delta75$ kHz tuned carrier.

The output of the filter 74 is connected to an AGC amplifier designated generally by the reference numeral 76. The AGC amplifier 76 used in the prototype of the practical embodiment shown in FIG. 15A includes a 3SK77 dual-gate MOS-FET device. The AGC amplifier 76 is advantageous because it allows the inclusion of an AGC detector in a subsequent component, as will be explained below. In the present invention, it is necessary for the signal level to be sufficiently high to drive the harmonics generator described below. The illustrated embodiment also includes a composite integrated circuit, preferably of the type LA1170. The LA1170 circuit 78 includes a superheterodyne mixer 80, a local oscillator 82, an AGC detector 84 and an IF amplifier 86. Passive resonating components for the local oscillator 82 in the LA1170 device are located outside of the LA1170 device and include capacitors C1, C2, C3 and C4, a coil L, and a pair of varactor diodes, for example, of the type 1SV55, designated collectively by the letter D.

The combination of the AGC amplifier 76 and the AGC detector 84 makes it possible to maintain high gain even under conditions where the incoming RF signals are weak. Under such conditions, for example, where the input signal to the antenna 20 is only a few microvolts, the AGC output port 88 of the LA1170 device 78 would have a high voltage of approximately 6 to 8 volts DC. This high level DC signal is connected via an AGC adjustment trimmer 90 to the second gate G2 of the 3SK77 AGC amplifier 76. As is shown in FIG. 15A, the output from the filter 74 is connected to the first gate G1 of the AGC amplifier 76. Under these conditions, the GM of the 3SK77 device is kept very high, so that the gain is maximized. When the signal level from the mixer 80 in the LA1170 device begins to approach the overload point of the mixer, the AGC output voltage begins to fall, thus lowering the GM of the 3SK77 device and in turn lowering the gain to prevent overloading the mixer. The inclusion of such automatic gain control devices as the AGC amplifier 76 and the AGC detector 84 in the LA1170 device is necessary in the illustrated exam only because of the limitations of the dynamic range of the LA1170 device itself, and may be excluded if the component chosen as the mixer 80 has a higher dynamic range. The signal spectrum from the filter 74 is therefore amplified by approximately 20 to 23 dB.

As is seen in FIG. 15A, the output signal the AGC amplifier 76 is connected to a mixer input M1 which is included in the LA1170 device. The second input port M2 of the mixer 80 receives a frequency deviated signal from the local oscillator 82. The oscillator 82 included in the LA1170 device is of a modified Colpitts type and the values of above-mentioned passive oscillating components are chosen so that the oscillator 82 has a nominal idle frequency of 12.84 MHz with no applied modulation. The oscillator 82 and its associated passive components corres to the local oscillator 36 in the second embodiment. It is to be noted that the varactor diodes change capacitance as a function of DC voltage which is applied to their junctions via a negative feedback path described below.

The illustrated practical embodiment also includes a limiter-detector 92, preferably a conventional HA12412 or LA1235, whose quiescent DC voltage level is approximately 5.8 volts. This voltage level is too low for the varactor diodes as it would cause their capacitance to be too high and the output frequency from the local oscillator 82 to be too low. In this example, a DC amplifier, designated generally by the reference numeral 94 and preferably consisting of one-half of an LM833 dual operational amplifier 96, is used in a unique voltage following mode. The feedback loop around the operational amplifier includes a Zener diode Z connected in parallel with an electrolytic capacitor C6 with high capacitance. The combination of the Zener diode Z and the capacitor C6 acts as a virtual short circuit for audio frequencies but provides a suitable shift of the DC level for the varactor diodes. The value of the Zener diode Z is arbitrary and depends entirely on the value chosen for a trimmer capacitor C7 and on the slope of the linear portion of the characteristic of the varactor diodes D.

The illustrated practical embodiment also includes a deviation adjustment control, designated generally by the reference numeral 100. The deviation adjustment control includes a potentiometer R and floats at the chosen DC voltage due to an electrolytic capacitor C7, which serves as a bypass capacitor to ground at one end of the control. The deviation adjustment control 100 is also used to adjust the system output voltage to compensate for gain variations in the limiter-detector circuit 92. Additionally, since the output impedance of the HA12412 or LA1235 device is typically high (5 kOhms), the operational amplifier 96 acts as a buffer by providing a low impedance system output.

The output signal from the wiper arm of the potentiometer R in the deviation adjustment control 100 is connected to the control input port (the junctions of the varactor diodes D) of the local oscillator system via a signal path 102, which constitutes a negative feedback path. Thus far in the description of the signal flow in the illustrated practical embodiment, all signals in the signal path have been of positive phase relative to the deviation of the input signal. This means that when the carrier modulation frequency deviates upwards, the system output voltage will change in the positive direction. Therefore, when the voltage along the negative feedback path becomes positive, the capacitance of the varactor diodes D will decrease and raise the frequency of the local oscillator 82 in correspondence with the negative feedback (deviation) voltage. The local oscillator 82 is therefore caused to deviate "in phase" with the carrier deviation, and when the two signals are combined in the mixer 80, the net deviation at the mixer output 104 will be reduced and correspond to the direct difference between the two deviation values, in the present case, $\pm\Delta 75$ kHz $-(\pm) \Delta 60$ kHz $= \pm\Delta 15$ kHz. The resultant conversion by the mixer 80 will therefore produce a 2.14 MHz $\pm\Delta 15$ kHz output signal.

The load for the mixer output can be arbitrarily chosen to be either tuned or untuned. In the present example, the output load is tuned, whereby the primary winding of a transformer T1 resonates with a capacitor C8. This provides the additional benefit that the tuning core of the transformer T1 can be adjusted slightly higher than its exact center point in order to yield a slightly net "positive" group delay, which very conveniently cancels the net "negative" group delay inherent in the rest of the circuit. This means that the total group delay at the system output can be made exceptionally low as well as extremely linear, which is advantageous for proper decoding in a subsequent multiplex decoder.

The IF amplifier 86 included in the LA1170 device 78 provides additional gain of approximately 20-23 dB. The output from the IF amplifier 86 is also is summed at connection point 105 into the negative input of an operational amplifier 106, which preferably consists of the other half of the LM833 device. This pick-off and summation extends the range of a signal meter output of the detector circuit. Prior to this summation, however, the signal is AC coupled and becomes an output signal showing the true multipath interference. This is much more accurate than other more traditional circuits. Due to the action of negative feedback and the resonation of the output of the mixer 80, not only is the selectivity greatly improved, there is also less interference from co-channel carriers which would otherwise cause false readings.

The output from the IF amplifier 86 corresponds to point B in FIG. 1.

The output from the IF amplifier 86 is also connected to a harmonics generator 108. In the illustrated practical embodiment, the harmonics generator 108 is a non-linear device consisting of a very high speed comparator such as an LM306. Used here in an open loop configuration, the harmonics generator 108 has a gain of approximately 60,000 and the signal at its output, corresponding to the point C in FIG. 1, is a rectangular waveform of approximately 2 volts RMS. An input voltage of approximately 30.0 microvolts RMS is therefore required. Adding up all of the positive gains and the component losses (such as filter losses, mixer net conversion losses, etc.), and assuming a nominal front end gain of 26 dB, the input sensitivity at the antenna 20 becomes approximately 0.24 microvolts, which is far below the noise floor and is therefore more than sufficient.

The non-linear harmonics generator 108 limits all the signals (carriers plus deviations) so that they appear at its output as rectangular waves. In the present illustrative embodiment, the fifth harmonic group is extracted by means of the filter 26 which is preferably another SFe10.7 mx ceramic band-pass filter with a center frequency of 10.7 MHz. Of course, 10.7 MHz is the fifth harmonic of the 2.14 MHz output signal from the IF amplifier 86, that is, the resultant mixed IF signal from the LA1170 device 78. As was explained in conjunction with the description of the first and second embodiments, the five-fold multiplication resulting from extraction of the fifth harmonic therefore reproduces the original IF tuned frequency. As was described above, the filter 26 provides a final degree of selectivity and also removes remaining spurious responses. With an original value of adjacent channel selectivity on the order of 12 dB, which is a normal value without feedback, the final performance of the illustrated practical embodiment including the feedback loop, which provides the deviation manipulation, is on the order of approximately 60 dB with no deterioration in the performance of the system.

As is seen in FIGS. 15A and 15B, the output of the filter 26 is connected as an input to the limiter-detector 92, which is provided as a composite integrated circuit and acts as a frequency demodulator. The present illustrative embodiment employs the well-known common principle of quadrature detection. FIG. 15B accordingly shows the double sets of coils. By using either of the above-mentioned commercially available composite integrated circuits for the limiter-detector 92, several additional features automatically become available. Such features include muting, mute control switching, etc. These features are, however, not pertinent to the present invention and are therefore not discussed further.

Finally, the output from the limiter-detector 92 is connected via the signal path 110 to the positive input port of the previously-described buffer operational amplifier 96.

Various active and passive components are typically required for proper operation and tuning of such devices as the limiter-detector 92, the AGC amplifier 76, the LM306 comparator, etc. Although shown in FIGS. 15A and 15B, these peripheral components will not be not described; those skilled in the art will readily understand the need for and choice of such peripheral components.

The practical embodiment of the present invention described above and illustrated in FIGS. 15A and 15B represents only one example of a well-functioning prototype. The present invention is of course not limited to the particular components or configuration mentioned in the discussion of the practical embodiment.

Neither is the present invention limited to the illustrative embodiments described above. In comparing the various described embodiments, it will be obvious to those skilled in the art that the present invention provides for great design flexibility—depending on the desired degree of frequency expansion, more than one harmonics generator and/or mixer and/or local oscillator and/or filter may be incorporated. By re-tuning the local oscillator(s), the steps of down conversion by the mixer(s) and multiplication by the harmonics generator(s) may be performed in either order.

As was mentioned above, the present invention is not limited to use in audio systems such as radios, nor to the particular frequency bands used in FM radio broadcasts. Examples of alternate uses such as radar and cellular telephones have been pointed out above. If a particular application involves significantly higher frequencies, or smaller initial channel spacing, the image and bleed-up phenomenon may not lessen the expanded guard band around the tuned carrier until the frequency expansion factor is much greater than 25. In such applications, the above-mentioned practical limit on the expansion factor to 25 or less will not be applicable. More than two mixer/multiplier stages may then be included to provide even higher expansion factors and, consequently, even greater improvement in separation and selectivity. Such applications are contemplated by the present invention and fall within the scope of the following claims.

What is claimed is:

1. A system for detecting and demodulating a frequency-modulated ("FM") tuned input carrier signal included in an FM input signal, which also includes a plurality of side input carrier signals separated in frequency from said tuned input carrier signal by first and second input guard bands, and for generating a demodulated output signal corresponding to said tuned input carrier signal, said tuned input carrier signal having a positive and a negative frequency deviation about a tuned input center frequency;

said system including a forward signal path and a feedback signal path and comprising:

frequency demodulation means for receiving and demodulating a filtered resultant signal and for generating said demodulated output signal;

filter means for band-pass filtering of a deviation-manipulated carrier signal and for generating said filtered resultant signal;

oscillation means in said feedback signal path for receiving said demodulated output signal and for generating a local RM signal with a local idle frequency and a local frequency deviation equal in polarity to the polarity of the frequency deviation of said tuned input carrier signal;

guard band expansion means for receiving said FM input signal and said local FM signal and for generating said deviation-manipulated carrier signal including a deviation-manipulated tuned carrier signal and deviation-manipulated side carrier signals;

said guard expansion means including:

mixing means comprising a subtracting superheterodyne converter for mixing a tuned input signal with said local FM signal for generating a down-converted mixed signal including a down-converted tuned carrier signal corresponding to said tuned carrier input signal, and a plurality of down-converted side carrier signals corresponding to said side input carrier signals; and frequency expansion means including harmonics generation means for receiving an input component signal and generating an output component signal having frequency components each equal to a predetermined harmonic of a corresponding frequency component of said input component signal;

said system including means for connecting said mixing means and said frequency expansion means in said forward signal path; and said deviation-manipulated side carrier signals being separated in frequency from said tuned resultant carrier signal by first and second resultant guard bands greater than said first and second input guard bands by a factor equal to the order of said predetermined harmonic.

2. A system as defined in claim 1, said FM input signal constituting said tuned input signal;

said down-converted mixed signal constituting said input component signal; and said output component signal constituting said deviation-manipulated carrier signal.

3. A system as defined in claim 1, said FM input signal constituting said input component signal;

said output component signal constituting said tuned input signal; and said down-converted mixed signal constituting said deviation-manipulated carrier signal.

4. A system as defined in claim 1, including amplitude limiting means after said filter means in said forward signal path.

5. A detection system for receiving a frequency-modulated ("FM") input signal comprising a plurality of input carrier signals, including a tuned input carrier signal and side input carrier signals, and for generating a demodulated output signal, said tuned input carrier signal being separated in frequency from said side input carrier signals of lower frequency by a first input guard band and from said side input carrier signals of higher frequency by a second input guard band;

said tuned input carrier signal having a positive and a negative frequency deviation about a tuned input center frequency;

said system including a forward signal path and at least one feedback signal path and comprising:

frequency demodulation means for receiving and demodulating a filtered resultant signal and for generating said demodulated output signal;

said resultant signal including a tuned resultant carrier signal, corresponding to said tuned input carrier signal, and side resultant carrier signals, corresponding to said side input carrier signals;

filter means for selective filtering of at least one deviation-manipulated carrier signal and for generating said filtered resultant signal;

oscillation means in said feedback signal path for receiving said demodulated output signal and for generating at least one local signal, each with a corresponding local center frequency and a corresponding local frequency deviation having a deviation polarity and direction of frequency shift equal to the deviation polarity and direction of frequency shift of said tuned carrier signal;

guard band expansion means for receiving said FM input signal and said at least one local signal and for generating said at least one deviation-manipulated resultant signal;

said side resultant carrier signals being separated in frequency from said tuned resultant carrier signal by a first resultant guard band greater than said first input guard band and a second resultant guard band greater than said second input guard band.

6. A detection system as defined in claim 5, in which said guard band expansion means includes:

at least one mixing means, each for mixing a corresponding tuned input signal with a corresponding one of said local signals for generating down-converted mixed signals, each mixed signal including a down-converted tuned carrier signal corresponding to said tuned carrier input signal, and a plurality of down-converted side carrier signals corresponding to said side input carrier signals and separated in frequency from said down-converted tuned carrier signal by a down-converted frequency guard band;

at least one frequency expansion means, each having a respective expansion factor, and each for receiving respective input frequency component signals and for generating respective output frequency component signals corresponding to a multiplication of said input frequency component signals by said expansion factor; and means for connecting each said frequency expansion means in said forward signal path with a corresponding one of said mixing means.

7. A detection system as defined in claim 6, in which each said frequency expansion means comprises means for generating said respective output frequency component signal as a predetermined harmonic of each said respective input frequency component signal.

8. A detection system as defined in claim 7, in which said frequency expansion means comprises square-wave generation means.

9. A detection system as defined in claim 7, in which said predetermined harmonic is odd.

10. A detection system as defined in claim 6, in which said mixing means comprises at least one subtracting superheterodyne converter.

11. A detection system as defined in claim 5, including amplitude limiting means after said filter means in said forward signal path.

12. A detection system as defined in claim 5, in which said tuned resultant signal is identical to said tuned input carrier signal.

13. A detection system as defined in claim 5, in which said FM input signal lies in the intermediate frequency band.

14. A detection system as defined in claim 5, including:

means for receiving radio frequency signals and for generating a radio frequency input signal;

means for converting said radio frequency input signal into said FM IF signal.

15. A method for detecting a tuned, frequency-modulated ("FM") carrier signal included in an FM input signal, which also includes a plurality of side input carrier signals and in which:

said tuned input carrier signal is separated in frequency from said side input carrier signals by first and second input guard bands;

said tuned input carrier signal has a positive and a negative frequency deviation about a tuned input center frequency;

said method including the steps of:

1) generating a demodulated output signal corresponding to said tuned carrier input signal;
2) generating at least one local FM signal in accordance with said demodulated output signal, each local FM signal having a predetermined idle frequency and a deviation equal in polarity and direction of frequency shift of said tuned input carrier signal;
3) generating a deviation-manipulated output signal having a resultant tuned carrier signal corresponding to said tuned input carrier signal and separated in frequency from resultant side carrier signals, corresponding to said side input carrier signals, by first and second resultant guard bands greater than said first and second input guard bands;
4) feeding back said demodulated output signal for generation of said deviation-manipulated output signal;
5) band-pass filtering said deviation-manipulated output signal before said generation of said demodulated output signal.

16. A method as defined in claim 15, in which said step of generating said deviation-manipulated output signal includes the steps:
1) generating at least one tuned input signal;
2) mixing each said tuned input signal with a corresponding one of said local FM signals for generating a down-converted carrier signal for each said carrier input signal; and
3) generating at least one frequency-expanded output signal, each with a respective pre-determined expansion factor, each frequency-expanded output signal containing component output signals corresponding to a multiplication of corresponding component input signals by said expansion factor, whereby said deviation-manipulated output signal consists of a final frequency-expanded output signal.

17. A method as defined in claim 16, in which each said frequency-expanded output signal is the harmonic of the respective component input signal of the order equal to said expansion factor.

18. A method as defined in claim 17, in which said harmonics are generated by the following steps:
1) square-wave conversion of each component input signal; and
2) band-pass filtering of said square waves.

19. A method as defined in claim 17 in which said harmonic is odd.

20. An FM receiver comprising:
means for receiving an FM signal;
means for forming an IF signal from said FM signal;
said IF signal including a tuned carrier separated from at least one adjacent carrier by a corresponding input guard band;
a voltage controlled oscillator ("VCO");
guard band expansion means included in a forward signal path and including a harmonic generator and a mixer coupled to receive signals from said VCO, and for generating an expanded output signal, with the ratio between the bandwidth of a tuned output carrier and the the bandwidth of an adjacent expanded guard band being less than the ratio between the bandwidth of said tuned carrier and the bandwidth of said input guard band;
means for connecting said harmonic generator and said mixer in said guard band expansion means;
means for applying said IF signal to said guard band expansion means;
means for detecting the expanded output signal from said guard band expansion means; and
means for varying the frequency of said oscillator in accordance with the detected output.

* * * * *